United States Patent
Xu et al.

(10) Patent No.: US 12,446,298 B2
(45) Date of Patent: Oct. 14, 2025

(54) ENHANCED CAPACITOR FOR INTEGRATION WITH METAL-OXIDE SEMICONDUCTOR FIELD-EFFECT TRANSISTOR

(71) Applicant: SHANGHAI BRIGHT POWER SEMICONDUCTOR CO., LTD., Shanghai (CN)

(72) Inventors: Shuming Xu, Shanghai (CN); Jian Wu, Shanghai (CN)

(73) Assignee: SHANGHAI BRIGHT POWER SEMICONDUCTOR CO., LTD., Shanghai (CN)

( * ) Notice: Subject to any disclaimer, the term of this patent is extended or adjusted under 35 U.S.C. 154(b) by 396 days.

(21) Appl. No.: 17/745,304

(22) Filed: May 16, 2022

(65) Prior Publication Data

US 2023/0238458 A1   Jul. 27, 2023
US 2025/0280594 A9   Sep. 4, 2025

(30) Foreign Application Priority Data

Jan. 26, 2022   (CN) .......................... 202210095007.0

(51) Int. Cl.

| | |
|---|---|
| *H01L 29/78* | (2006.01) |
| *H01L 21/762* | (2006.01) |
| *H01L 29/66* | (2006.01) |
| *H01L 29/94* | (2006.01) |
| *H10D 1/66* | (2025.01) |
| *H10D 30/01* | (2025.01) |
| *H10D 84/00* | (2025.01) |

(52) U.S. Cl.
CPC ..... *H10D 84/151* (2025.01); *H01L 21/76202* (2013.01); *H01L 21/76224* (2013.01); *H10D 1/66* (2025.01); *H10D 30/0281* (2025.01)

(58) Field of Classification Search
CPC . H01L 27/0629; H01L 29/7817; H01L 29/92; H01L 29/94; H01L 29/945; H10D 64/111; H10D 62/116; H10D 30/0281; H10D 30/65; H10D 64/516; H10D 64/519; H10D 84/151
See application file for complete search history.

(56) References Cited

U.S. PATENT DOCUMENTS

| | | | |
|---|---|---|---|
| 8,772,871 B2 * | 7/2014 | Yang | H01L 29/7835 257/408 |
| 2019/0341491 A1 * | 11/2019 | Huang | H01L 29/0878 |
| 2022/0384594 A1 * | 12/2022 | Xu | H01L 29/1095 |

* cited by examiner

*Primary Examiner* — Raj R Gupta
(74) *Attorney, Agent, or Firm* — Myers Bigel, P.A.

(57) ABSTRACT

A capacitor is provided for integration with a MOSFET device(s) formed on the same substrate. The capacitor comprises a first plate including a doped semiconductor layer of a first conductivity type, an insulating layer formed on an upper surface of the doped semiconductor layer, and a second plate including a polysilicon layer formed on an upper surface of the insulating layer. An inversion layer is formed in the doped semiconductor layer, beneath the insulating layer and proximate the upper surface of the doped semiconductor layer, as a function of an applied voltage between the first and second plates of the capacitor. At least one doped region of a second conductivity type, opposite the first conductivity type, is formed in the doped semiconductor layer adjacent to a drain and/or source region of the first conductivity type formed in the MOSFET device. The doped region is electrically connected to the inversion layer.

21 Claims, 21 Drawing Sheets

ENHANCED CAPACITOR FOR INTEGRATION WITH METAL-OXIDE SEMICONDUCTOR FIELD-EFFECT TRANSISTOR

CROSS-REFERENCE TO RELATED APPLICATIONS

The present application is a counterpart of, and claims priority to, Chinese Patent Application No. 202210095007.0, filed on Jan. 26, 2022, the disclosure of which is incorporated by reference herein in its entirety for all purposes.

BACKGROUND

The present invention relates generally to the electrical, electronic and computer arts, and, more particularly, to capacitors for integration with metal-oxide semiconductor field-effect transistor devices.

Modern wireless communication circuits and systems have placed extremely stringent requirements on both power and linearity performance of, for example, power amplifiers and switching circuitry operating at microwave frequencies. These ever-increasing power and linearity requirements have placed a challenging burden on the design of high-frequency, high-power circuit components. Silicon laterally-diffused metal-oxide semiconductor (LDMOS) power transistors have dominated such applications over the past years. However, with the approaching limits of operability for such devices, there will be a need for other semiconductor materials and/or device architectures to fulfill the high-power and high-linearity requirements of next generation wireless technology.

It is well known to employ a field plate structure in an LDMOS device. A field plate is essentially an extension of the gate over a drift region in the LDMOS device. The field plate, which is typically formed of polysilicon, has been shown to not only enhance breakdown voltage in the LDMOS device but also to suppress a surface state, which markedly affects the power performance of the device. The large gate polysilicon area also helps to accumulate electrons in the drift region under the field plate during an on-state of the LDMOS device, thereby reducing an on-resistance ($R_{DSon}$) of the device.

Unfortunately, while the field plate structure in a conventional MOSFET device helps to increase the breakdown voltage of the device through modulating the electric field locally, it introduces additional parasitic feedback capacitance, also referred to as Miller capacitance, from drain to gate ($C_{gd}$). More particularly, from a circuit standpoint, the field plate behaves as a gate-to-drain feedback capacitor which provides additional modulation of signals at the input and output of the device. Such parasitic feedback capacitance undesirably impacts the overall high-frequency performance of the device, particularly in high-speed switching applications, due at least in part to the additional phase variations provided through the feedback path.

SUMMARY

The present invention, as manifested in one or more embodiments, beneficially provides an enhanced capacitor adapted for integration with an LDMOS transistor device, and methods for fabricating such a device. This integrated capacitor is advantageously compatible with existing complementary metal-oxide semiconductor (CMOS) fabrication technology and does not rely on the use of costly processes and materials, such as, for instance, a dual silicide structure, to achieve a substantial improvement in device high-frequency performance. Moreover, embodiments of the present invention advantageously achieve enhanced high-frequency performance, for example by reducing gate charge ($Q_g$) and/or reducing gate-to-drain capacitance ($C_{gd}$), without significantly degrading breakdown voltage and/or on-resistance ($R_{DSon}$) in the device.

In accordance with an embodiment of the invention, a capacitor is provided for integration with a MOSFET device (s) formed on the same substrate. The capacitor comprises a first plate including a doped semiconductor layer of a first conductivity type, an insulating layer formed on an upper surface of the doped semiconductor layer, and a second plate including a polysilicon layer formed on an upper surface of the insulating layer. An inversion layer is formed in the doped semiconductor layer, beneath the insulating layer and proximate the upper surface of the doped semiconductor layer, as a function of an applied voltage between the first and second plates of the capacitor. At least one doped region of a second conductivity type, opposite the first conductivity type, is formed in the doped semiconductor layer adjacent to a drain and/or source region of the first conductivity type formed in the MOSFET device. The doped region is electrically connected to the inversion layer.

In accordance with another embodiment of the invention, a method of fabricating a capacitor configured for integration with at least one metal-oxide-semiconductor field-effect transistor (MOSFET) device includes: forming a first plate comprising a doped semiconductor layer of a first conductivity type; forming an insulating layer on at least a portion of an upper surface of the doped semiconductor layer; forming a second plate comprising a polysilicon layer on at least a portion of an upper surface of the insulating layer, wherein an inversion layer is created in the doped semiconductor layer, beneath at least a portion of the insulating layer and proximate the upper surface of the doped semiconductor layer, as a function of an applied voltage between the first and second plates of the capacitor; and forming at least one doped region of a second conductivity type in the doped semiconductor layer proximate the upper surface of the doped semiconductor layer and adjacent to one of a drain region and a source region of the first conductivity type formed in the MOSFET device, the doped region being electrically connected to the inversion layer, the second conductivity type being opposite in polarity to the first conductivity type.

In accordance with yet another embodiment of the invention, a DC-DC voltage converter circuit includes a first MOSFET device, the first MOSFET device having a drain coupled with an input node of the converter circuit, a source coupled with a switching node of the converter circuit, and a gate, the input node being adapted to receive an input voltage applied to the converter circuit. The voltage converter circuit further includes a second MOSFET device, the second MOSFET device having a drain coupled with the switching node of the converter circuit, a source coupled with a voltage return of the converter circuit, and a gate. The DC-DC voltage converter circuit includes a controller circuit coupled with the first and second MOSFET devices, the controller circuit being configured to generate first and second control signals supplied to the gates of the first and second MOSFET devices for controlling activation of the MOSFET devices. At least one energy storage element is coupled between the switching node and an output of the converter circuit.

The DC-DC voltage converter circuit further includes an input capacitor coupled between the input node and voltage return of the converter circuit, the input capacitor being integrated with at least one of the first and second MOSFET devices. The input capacitor includes a first plate comprising a doped semiconductor layer of a first conductivity type, the doped semiconductor layer forming at least one of a drift drain region and a body region of at least one of the first and second MOSFET devices. The input capacitor further includes an insulating layer formed on at least a portion of an upper surface of the doped semiconductor layer, and a second plate including a polysilicon layer formed on at least a portion of an upper surface of the insulating layer. An inversion layer is formed in the doped semiconductor layer, beneath at least a portion of the insulating layer and proximate the upper surface of the doped semiconductor layer, as a function of the input voltage applied between the first and second plates of the capacitor. The input capacitor further includes at least one doped region of a second conductivity type (opposite in polarity to the first conductivity type) formed in the doped semiconductor layer proximate the upper surface of the doped semiconductor layer and adjacent to the drain and/or source of at least one of the first and second MOSFET devices. The doped region is electrically connected to the inversion layer.

Techniques of the present invention can provide substantial beneficial technical effects. By way of example only and without limitation, an integrated capacitor according to one or more embodiments of the invention may provide one or more of the following advantages:

a high-value capacitor in a substantially small footprint;
compatible with standard CMOS fabrication technology;
lower switching loss;
enhanced high-frequency performance;
superior integration with DC-DC voltage converter applications.

These and other features and advantages of the present invention will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

Figure 1A:
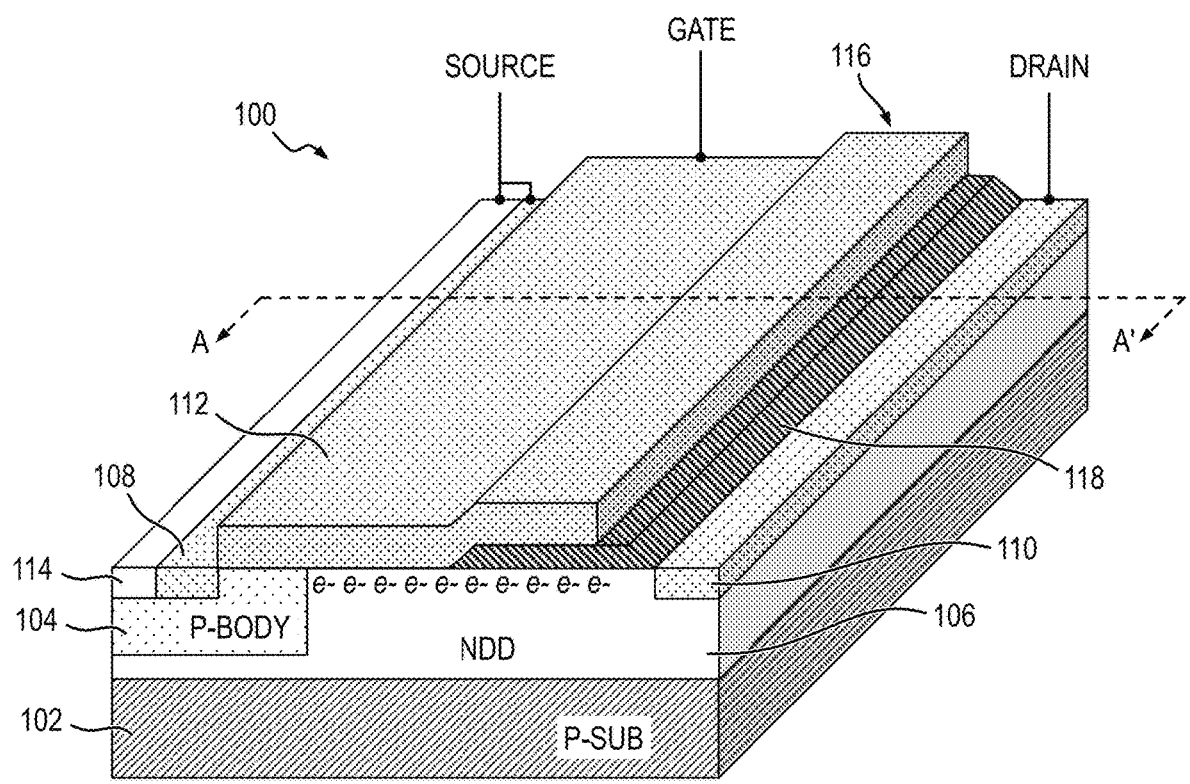
FIG. 1A is a perspective view depicting at least a portion of an illustrative laterally-diffused metal-oxide semiconductor (LDMOS) device having a field plate.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present invention, as manifested in one or more embodiments, will be described herein in the context of an illustrative laterally-diffused metal-oxide semiconductor (LDMOS) device, and methods for fabricating an LDMOS device, having a field plate structure configured to enhance high-frequency performance without significantly degrading power and linearity performance in the device. It is to be appreciated, however, that the invention is not limited to the specific device(s) and/or method(s) illustratively shown and described herein. Rather, it will become apparent to those skilled in the art given the teachings herein that numerous modifications can be made to the embodiments shown that are within the scope of the claimed invention. That is, no limitations with respect to the embodiments shown and described herein are intended or should be inferred.

For the purpose of describing and claiming embodiments of the invention, the term MISFET as may be used herein is intended to be construed broadly and to encompass any type of metal-insulator-semiconductor field-effect transistor. The term MISFET is, for example, intended to encompass semiconductor field-effect transistors that utilize an oxide material as their gate dielectric (i.e., MOSFETs), as well as those that do not. In addition, despite a reference to the term "metal" in the acronyms MISFET and MOSFET, the terms MISFET and MOSFET are also intended to encompass semiconductor field-effect transistors wherein the gate is formed from a non-metal material such as, for instance, polysilicon; the terms "MISFET" and "MOSFET" are used interchangeably herein.

Although the overall fabrication method and structures formed thereby are entirely novel, certain individual processing steps required to implement a portion or portions of the method(s) according to one or more embodiments of the invention may utilize conventional semiconductor fabrication techniques and conventional semiconductor fabrication tooling. These techniques and tooling will already be familiar to one having ordinary skill in the relevant arts. Moreover, many of the processing steps and tooling used to fabricate semiconductor devices are also described in a number of readily available publications, including, for example: P. H. Holloway et al., *Handbook of Compound Semiconductors: Growth, Processing, Characterization, and Devices*, Cambridge University Press, 2008; and R. K. Willardson et al., *Processing and Properties of Compound Semiconductors*, Academic Press, 2001, which are incorporated by reference herein in their entireties. It is emphasized that while some individual processing steps are set forth herein, those steps are merely illustrative and one skilled in the art may be familiar with several equally suitable alternatives that would also fall within the scope of the present invention.

It is to be understood that the various layers and/or regions shown in the accompanying figures are not necessarily drawn to scale. Furthermore, one or more semiconductor layers of a type commonly used in such integrated circuit devices may not be explicitly shown in a given figure for economy of description. This does not imply, however, that the semiconductor layer(s) not explicitly shown are omitted in the actual integrated circuit device.

Figure 1B:
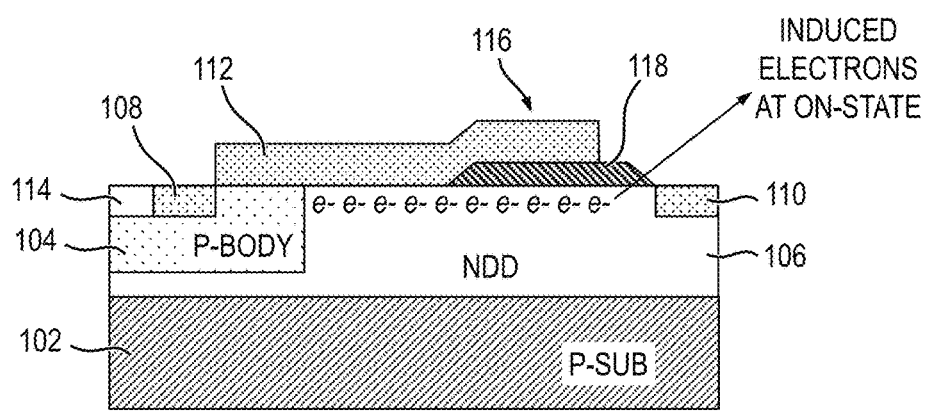
FIG. 1B is a cross-sectional view depicting at least a portion of the LDMOS device illustrated in FIG. 1A, taken along line A-A'.

FIGS. 1A and 1B are perspective and cross-sectional views, respectively, depicting at least a portion of an illustrative LDMOS device 100 incorporating a field plate structure therein; FIG. 1B is a cross-sectional view of the LDMOS device 100 shown in FIG. 1A taken along line A-A'. Specifically, the LDMOS device 100 includes a substrate 102 which may be formed of single-crystalline silicon. The substrate 102 is preferably modified by adding an impurity or dopant (e.g., boron, phosphorus, arsenic, etc.) to change a conductivity of the material (e.g., n-type or p-type polarity). In this example, since the LDMOS device 100 is an n-channel transistor, the substrate 102 is of p-type conductivity and may thus be referred to as p-substrate (P-SUB).

A body region 104, which in this embodiment is of p-type conductivity (p-body), is formed proximate the upper surface of the substrate 102, extending laterally from a source side toward a drain side of the device. A lightly-doped drift (LDD) region 106 is formed proximate the upper surface of the substrate 102 and laterally adjacent to the body region 104. The LDD region 106 has a conductivity type that is opposite that of the body region 104, in this example, n-type conductivity, and is therefore referred to as an n-type drain drift (NDD) region.

The LDMOS transistor 100 includes a source region 108, a drain region 110 and a gate 112. The source and drain regions 108 and 110, respectively, are formed proximate an upper surface of the substrate 102 and spaced laterally from one another. The source and drain regions 108, 110 are preferably doped, such as by a conventional implant step, with an impurity of a known concentration level to selectively change the conductivity of the material as desired. In this example, the source and drain regions 108, 110 are of n-type conductivity.

The source region 108 is formed in at least a portion of the body region 104, and the drain region 110 is formed in at least a portion of the NDD region 106. A heavily-doped region 114 having a conductivity type the same as the body region 104 (i.e., p-type in this example) is formed proximate the upper surface of the substrate 102, laterally adjacent to the source region 108 and within the body region, to form a body contact of the LDMOS device 100. The source region 108 is electrically connected to the body contact 114.

The gate 112 is formed between the source and drain regions 108, 110 and above at least a portion of the body region 104. Although not explicitly shown, a thin oxide layer (e.g., silicon dioxide ($SiO_2$)), referred herein to as gate oxide, is formed under the gate 112 for electrically isolating the gate from the source and drain regions 108, 110 in the LDMOS device 100. As is well understood by those skilled in the art, a bias applied to the gate induces the formation of a channel in the body region 104 under the gate for controlling a current flow between the source region 108 and drain region 110.

As apparent from FIGS. 1A and 1B, the gate 112 is configured having a portion 116 that extends laterally over the NDD region 106 and ends before the drain region 110. This gate extension portion 116, which is formed on a dielectric layer 118 having a thickness that is greater compared to a thickness of the gate oxide, is typically referred to as a field plate. The field plate 116, which in this example is a continuous extension of the gate 112, functions to modulate an electric field in the LDMOS device 100 which increases the breakdown voltage of the device. The field plate 116 also induces electrons to collect proximate an upper surface of the NDD region 106 at an on-state of the LDMOS device 100, which reduces on-state resistance ($R_D$S-on).

As previously explained, LDMOS power transistors have dominated high-power applications over the past years, particularly power amplifier applications used, for example, in wireless communication systems. While it is well-known to employ a field plate structure in a MOSFET device to increase the breakdown voltage of the device through modulation of the electric field locally, the additional parasitic feedback capacitance introduced by standard field plate structures undesirably impacts the overall high-frequency performance of the device and renders the device essentially unsuitable for high-frequency applications without utilizing esoteric and costly materials and/or fabrication processes.

To meet the frequency performance criteria of modern high-frequency applications, it is desirable to reduce parasitic gate-to-drain capacitance, $C_{gd}$. In general, the capacitance, C, of a parallel plate capacitor is defined according to the following expression:

$$C=\varepsilon_0\varepsilon_r A/d,$$

where $\varepsilon_0$ is absolute permittivity (i.e., the permittivity of a vacuum $\varepsilon_0=8.854\times10^{-12}$ F./m), $\varepsilon_r$ is relative permittivity of the medium or dielectric material between the parallel plates, A is the surface area of a side of each of the parallel plates, and d is a distance between the plates (i.e., a thickness of the dielectric material between the plates). Thus, in order to reduce the capacitance, the thickness of the dielectric material between the plates can be increased and/or the surface area of one or both plates can be reduced.

In order to achieve enhanced high-frequency performance in an LDMOS device without significantly impacting power and linearity performance in the device, the present invention, as manifested in one or more embodiments thereof, provides an LDMOS device having a novel field plate structure configured to reduce overlap area between the gate and drain, thereby advantageously reducing parasitic gate-to-drain capacitance ($C_{gd}$) in the device.

Figure 2:
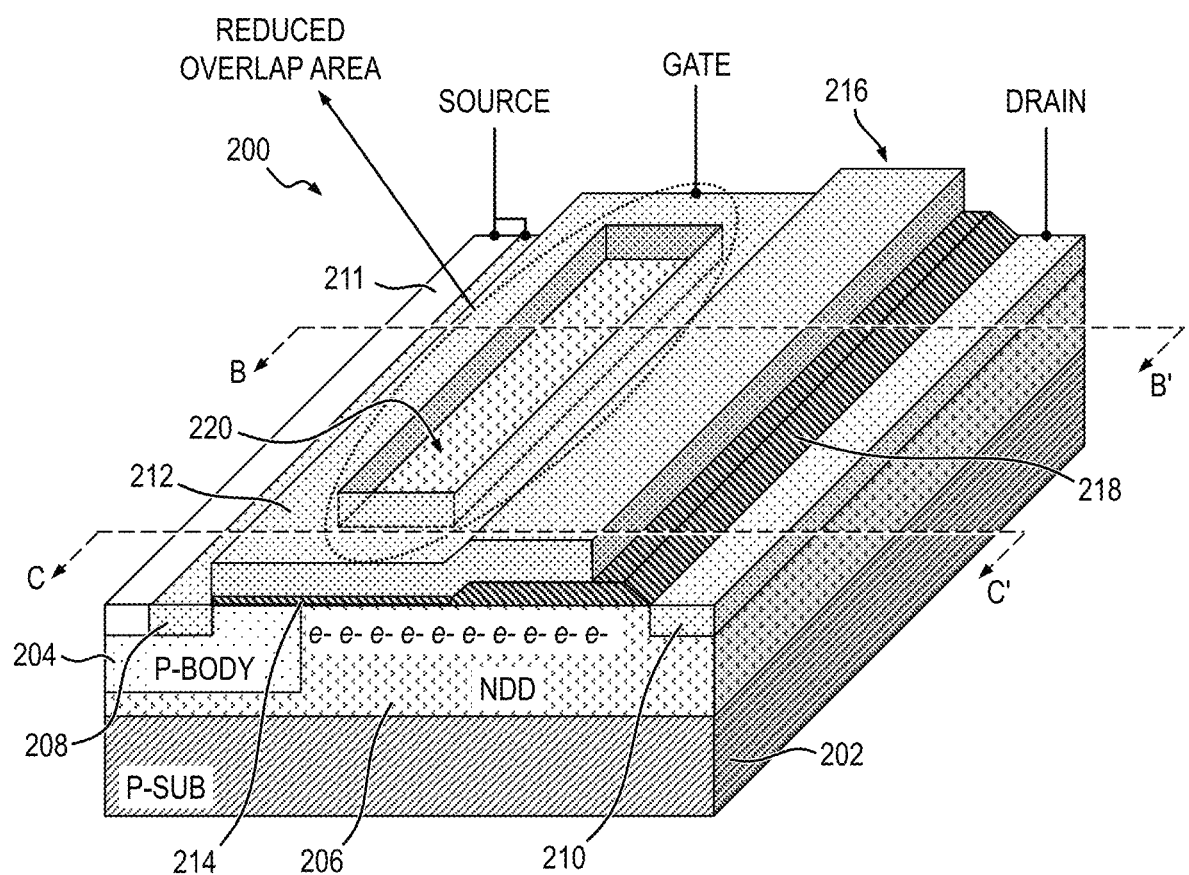
FIG. 2 is a perspective view depicting at least a portion of an exemplary LDMOS device including a field plate structure having reduced parasitic capacitance, according to an embodiment of the present invention.
Figure 3:
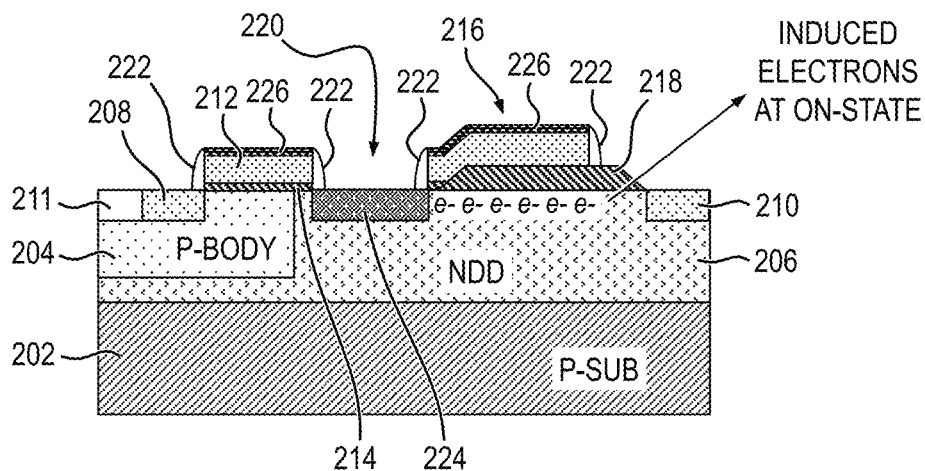
FIG. 3 is a cross-sectional view depicting at least a portion of the exemplary LDMOS device shown in FIG. 2, taken along line B-B', according to an embodiment of the present invention.
Figure 4:
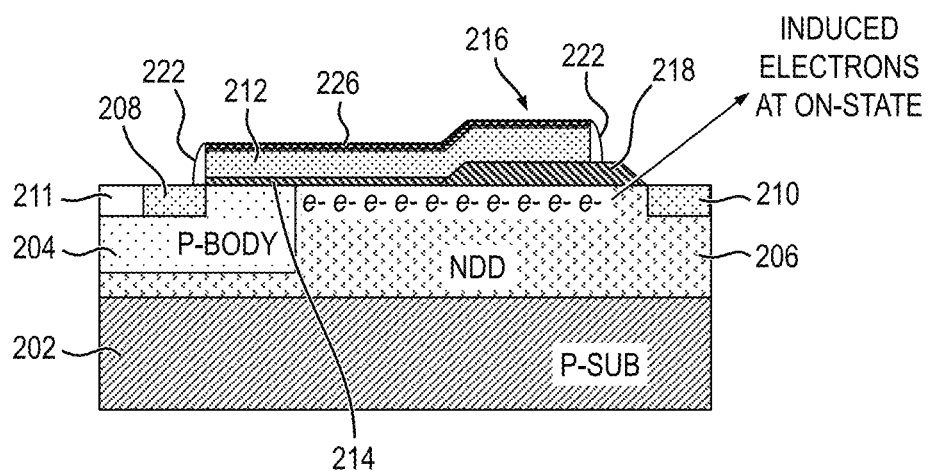
FIG. 4 is a cross-sectional view depicting at least a portion of the exemplary LDMOS device shown in FIG. 2, taken along line C-C', according to an embodiment of the present invention.

FIGS. 2-4 conceptually depict at least a portion of an exemplary LDMOS device 200 including a field plate structure having reduced parasitic capacitance, according to an embodiment of the invention; FIG. 2 is a perspective view depicting at least a portion of the exemplary LDMOS device 200, FIG. 3 is a cross-sectional view depicting at least a portion of the exemplary LDMOS device 200 taken along line B-B', and FIG. 4 is a cross-sectional view depicting at least a portion of the exemplary LDMOS device 200 taken along line C-C'. The LDMOS device 200 includes a semiconductor substrate 202. The substrate 202, in one or more embodiments, is formed of single-crystalline silicon (e.g., having a <100> or <111> crystal orientation), although suitable alternative materials may also be used, such as, but not limited to, germanium, silicon germanium, silicon carbide, gallium arsenide, gallium nitride, or the like. Additionally, in one or more embodiments the substrate 202 is preferably modified by adding an impurity or dopant (e.g., boron, phosphorus, arsenic, etc.) to change a conductivity of the material (e.g., n-type or p-type). In one or more embodiments, the substrate 202 is of p-type conductivity and may thus be referred to as p-substrate (P-SUB). A p-substrate may be formed by adding a p-type impurity or dopant (e.g., Group III elements, such as boron) of a prescribed concentration level (e.g., about $10^{14}$ to about $10^{18}$ atoms per cubic centimeter) to the substrate material, such as by using a diffusion or implant step, to change the conductivity of the material as desired. In one or more alternative embodiments, an n-substrate may be formed by adding an n-type impurity or dopant (e.g., Group V elements, such as phosphorus) of a prescribed concentration level to the substrate material.

A lightly-doped drain drift or drain extension region 206 is formed on at least a portion of the substrate 202, proximate the upper surface thereof. The drain drift region 206 has a conductivity type opposite the conductivity type of the substrate 202. In one or more embodiments, when using a p-substrate 202 the drain drift region 206 is of n-type conductivity, which may be formed by implanting an n-type impurity (e.g., phosphorus) into a defined area of the substrate using standard CMOS fabrication techniques, and is therefore referred to herein as an n-type drain drift (NDD) region. The doping concentration of the NDD region 206 is strongly correlated with the breakdown voltage of the LDMOS device 200, and thus by controlling the doping level of the NDD region 206, among other factors, a desired breakdown voltage can be achieved in the device.

A local low-resistivity body region 204 is formed in at least a portion of the NDD region 206. The body region 204 has a conductivity type that is opposite the conductivity type of the drain drift region 206. In one or more embodiments, the body region 204 comprises a p-type well (or p-well) disposed proximate an upper surface of the NDD region 206. The body region 204, in this exemplary embodiment, is formed by implanting a p-type impurity (e.g., boron) into a defined area of the NDD region 206 using standard CMOS fabrication techniques. The body region 204, although being of the same conductivity type as the substrate 202, is preferably more heavily doped relative to the doping level of the substrate, such that the body region has a lower resistivity than the substrate, such as, for example about 0.01 to 0.3 Ω-cm. In one or more alternative embodiments where an n-type substrate 202 is employed, the body region 204 may comprise an n-type well that is formed using similar CMOS fabrication techniques.

First and second heavily-doped regions having an opposite conductivity type/polarity (e.g., n-type) relative to the substrate 202 are formed proximate an upper surface of the LDMOS device 200 and define a source region 208 and drain region 210 of the LDMOS device; the source region is formed in the body region 204 and the drain region is formed in the NDD region. In one or more embodiments, the source and drain regions 208, 210 are comprised of heavily-doped n-type material formed using a standard CMOS implant process. Specifically, standard CMOS fabrication technology may implant the source region 208 and the drain region 210 with n-type material to form a first n+ region corresponding to the source region 208 and a second n+ region corresponding to the drain region 210. The n-type material includes impurity atoms of a donor type, such as, but not limited to, phosphorus, arsenic, antimony, or the like, that are capable of donating electrons. Implanting the source region 208 and/or the drain region 210 with the n-type material causes the carrier electron density in the source region 208 and/or the drain region 210 to exceed a carrier hole density.

A heavily-doped region 211 having a conductivity type the same as the body region 204 (i.e., p-type in this example), only having a higher dopant level than the body region, is formed in the body region, proximate the upper surface thereof and laterally adjacent to the source region 208, to form a body contact of the LDMOS device 200. The source region 208 is electrically connected to the body contact 211, for example during a subsequent metallization step.

With continued reference to FIGS. 2-4, a gate 212 is formed above the body region 204, proximate the upper surface of the wafer and between the source and drain regions 208, 210. The gate 212 is electrically isolated from the body region 204 and NDD region 206 by a thin insulating layer 214 disposed on the upper surface of the wafer on which the gate is formed. The thin insulating layer 214 may, in some embodiments, be formed of an oxide (e.g., silicon dioxide), and thus may be referred to herein as a gate oxide layer. The gate 212 is preferably formed of heavily-doped polysilicon, although other materials for forming the gate are similarly contemplated (e.g., a metal). As will be understood by those skilled in the art, when a bias voltage is applied between the gate 212 and source region 208, an inversion layer or channel is induced in the body region 204 under the gate oxide layer 214 via a field effect principle. The channel is operative to facilitate a flow of current between the source and drain regions 208, 210 of the LDMOS device 200, a magnitude of the current being controlled as a function of the applied voltage.

In the illustrative embodiment of FIGS. 2-4, the gate 212 includes a shielding structure 216 that is preferably formed as a homogeneous extension of the gate 212, extending laterally over at least a portion of the NDD region 206. The shielding structure 216, also referred to as a Faraday shield or field plate, is configured, in one or more embodiments, as a stepped structure having a first end disposed contiguous with the gate 212, and a second end extending laterally from the first end and disposed over the NDD region 206. The field plate (i.e., shielding structure) 216 is electrically isolated from the NDD region 206 by an insulating layer 218. The insulating layer 218, in one or more embodiments, is formed as an extension of the gate oxide layer 214, between the NDD region 206 and the field plate 216, and has a thickness that is greater relative to a thickness of the gate oxide layer. The field plate 216, being an extension of the gate 212 in this example, is formed of the same material as the gate (e.g., doped polysilicon), although other embodiments of the invention are similarly contemplated in which the gate and field plate are formed as separate structures of the same or different materials. The field plate 216 functions primarily to mitigate a locally high electric field that is often present at a gate edge on the drain side of the LDMOS device 200, which can result in electron injection (e.g., hot carrier injection (HCI)) into the gate oxide layer 214 leading to threshold drift which deteriorates linearity.

The field plate 216, according to aspects of the invention, is configured to reduce overlap area between the gate and drain, thereby advantageously reducing parasitic gate-to-drain capacitance in the device, as previously explained. Specifically, in one or more embodiments the field plate 216 is formed having at least one opening 220 therein exposing at least a portion of the underlying NDD region 206. This opening 220 in the field plate 216 is configured to reduce an amount of overlap area (i.e., the portion of the gate overlapping the NDD region), which beneficially reduces the gate-to-drain capacitance in the LDMOS device 200. The extent of the reduction in gate-to-drain capacitance will be a function of the dimensions of the opening 220. The gate-to-drain capacitance will be inversely proportional to the area of the opening 220; that is, the larger the area of the opening 220, the smaller the gate-to-drain capacitance.

Figure 5:
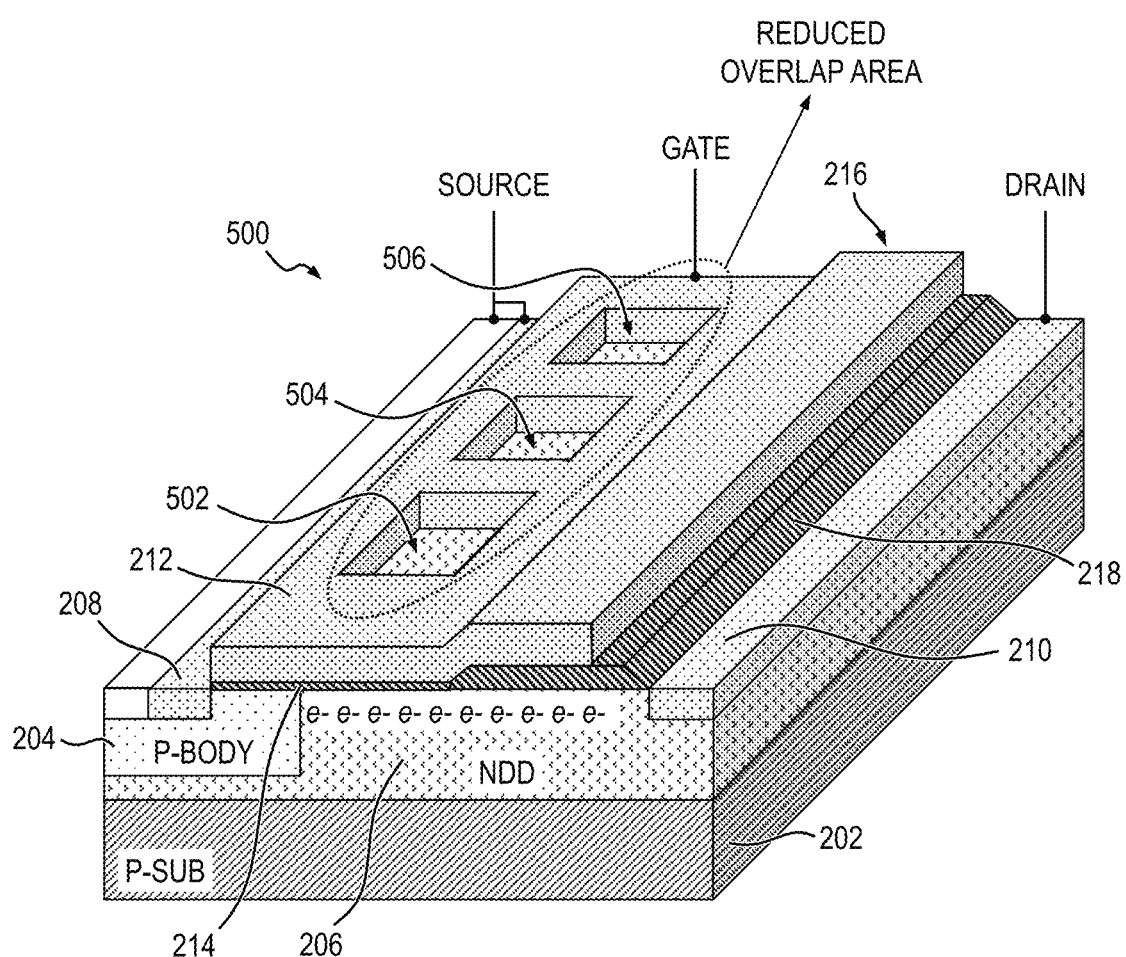
FIG. 5 a perspective view depicting at least a portion of an exemplary LDMOS device including a field plate structure having multiple openings formed therein, according to an embodiment of the present invention.

Although the opening 220 is depicted as being rectangular in shape, it is to be appreciated that embodiments of the invention are not limited to any specific shape or dimensions. For example, in one or more embodiments, the opening 220 may be substantially oval in shape. Furthermore, a field plate having multiple openings is similarly contemplated by embodiments of the invention. Specifically, with reference to the alternative embodiment shown in FIG. 5, the field plate 216 in LDMOS device 500 is configured having a plurality of openings 502, 504 and 506, overlying the NDD region 206. It is to be understood that embodiments of the invention are not limited to any specific number of openings, nor are embodiments limited to any specific shape and/or dimensions of each of the openings 502, 504, 506.

Although omitted in FIG. 2, dielectric spacers 222 are preferably formed on sidewalls of the gate 212 and field plate 216, as illustrated in FIGS. 3 and 4. The dielectric spacers 222 electrically isolate the gate 212 and field plate 216 from other elements of the LDMOS device 200. Optionally, with reference to FIG. 3, an implant layer 224 is formed in the NDD region 206, proximate the upper surface of the NDD region, underlying the opening 220 between the gate 212 and the field plate 216. In this illustrative embodiment, the implant layer 224 is doped with an n-type impurity of a prescribed concentration level (e.g., about $10^{15}$ to about $10^{18}$ atoms per cubic centimeter).

The implant layer 224 serves, at least in part, to increase the n-type concentration at the channel end closest to the drain region 210, thereby reducing the on-resistance, $R_{DS\text{-}on}$, along the current path between the source and drain regions. The implant layer 224 also serves to limit the channel region under the gate 212, effectively forming a self-aligned channel extension that enables the use of a shorter gate length and enhances stability. In high-frequency applications, smaller gate length equates to smaller gate charge ($Q_g$), which is desirable. When the gate length is reduced below a certain dimension (e.g., smaller than a p-body lateral diffusion length), the LDMOS device will be harder to turn on due to the p-type body region 204 extending beyond the gate 212. With the addition of the n-type implant layer 224, the p-type body region 204 that extends beyond the gate 212 will be anti-doped to n-type conductivity (in this exemplary embodiment), thereby making the LDMOS device 200 easier to turn on and less influenced by the unstable lateral diffusion of the body region 206.

In one or more embodiments, a layer of silicide 226, an alloy of metal and silicon, is formed on at least a portion of an upper surface of the gate 212 and field plate structure 216 to reduce a resistivity of the gate and field plate structure. Although not explicitly shown, a silicide layer may also be formed on at least a portion of an upper surface of the source region 208 and drain region 210 for forming low-resistance interconnections between the source region and a corresponding source contact, and between the drain region and a corresponding drain contact. The source and drain contacts (not explicitly shown, but implied) provide electrical connection with the source and drain regions 208, 210, respectively, of the LDMOS device 200.

Using standard CMOS fabrication steps, once the front-end processing used to form the LDMOS device 200 has been completed, the LDMOS device can be interconnected with one or more components fabricated on the same wafer to form a desired electrical circuit. This occurs in a series of wafer processing steps collectively referred to as back-end-of-line (BEOL) processing. BEOL processing primarily involves creating metal interconnects that are isolated by insulating (i.e., dielectric) layers. The insulating material used to form the dielectric layers has traditionally been a form of silicon dioxide ($SiO_2$), although other materials are similarly contemplated by embodiments of the invention (e.g., silicate glass, etc.).

Figure 6A:
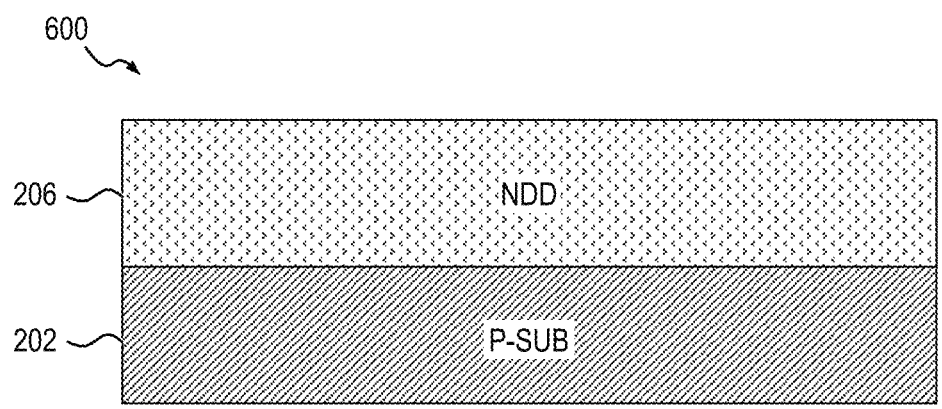
FIGS. 6A through 6E are cross-sectional views depicting at least a portion of exemplary processing steps in the fabrication of the exemplary LDMOS device shown in FIG. 3, according to an embodiment of the present invention.

By way of example only and without limitation, FIGS. 6A through 6E are cross-sectional views depicting at least a portion of exemplary intermediate processing steps 600 in the fabrication of the illustrative LDMOS device 200 shown in FIG. 3, according to an embodiment of the invention. With reference to FIG. 6A, the illustrative fabrication process 600 starts with a substrate 202, which in one or more embodiments comprises single-crystalline silicon or an alternative semiconductor material, such as, but not limited to, germanium, silicon germanium, silicon carbide, gallium arsenide, gallium nitride, or the like. In this illustrative embodiment, the substrate 202 is doped with a p-type impurity or dopant (e.g., boron, phosphorus, arsenic, etc.) to form a p-type conductivity substrate, or p-substrate (P-SUB). Embodiments of the invention are also contemplated in which an n-type conductivity substrate is employed. An NDD region 206 is formed on the upper surface of at least a portion of the substrate 202. The NDD region 206 is preferably formed, in one or more embodiments, using an implantation process, such as, for example, ion implantation.

Figure 6B:
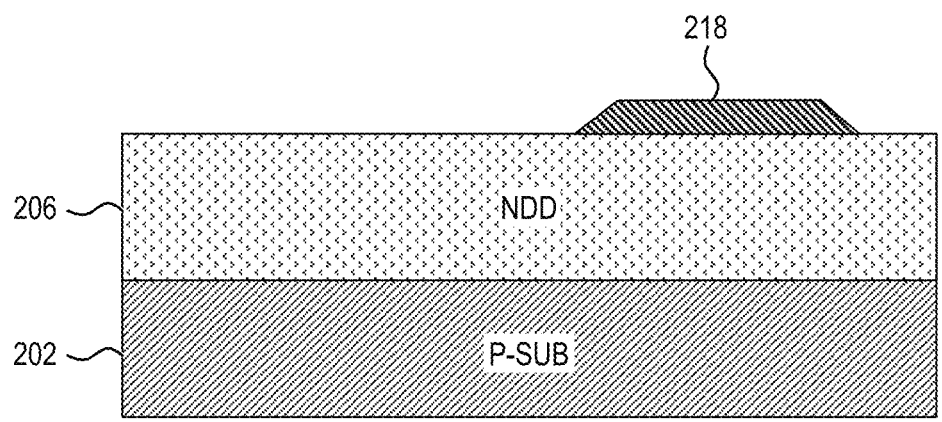

Referring now to FIG. 6B, a thick (high-voltage) insulating layer 218 is formed on at least a portion of the upper surface of the NDD region 206. In one or more embodiments, the insulating layer 218 comprises an oxide (e.g., silicon dioxide ($SiO_2$)) formed using a standard oxidation process, although the use of other suitable insulating materials is similarly contemplated. A deposition process may also be used to form the high-voltage insulating layer 218. The high-voltage insulting layer 218 is then patterned using standard photolithography and etching, with the resulting structure shown in FIG. 6B.

Figure 6C:
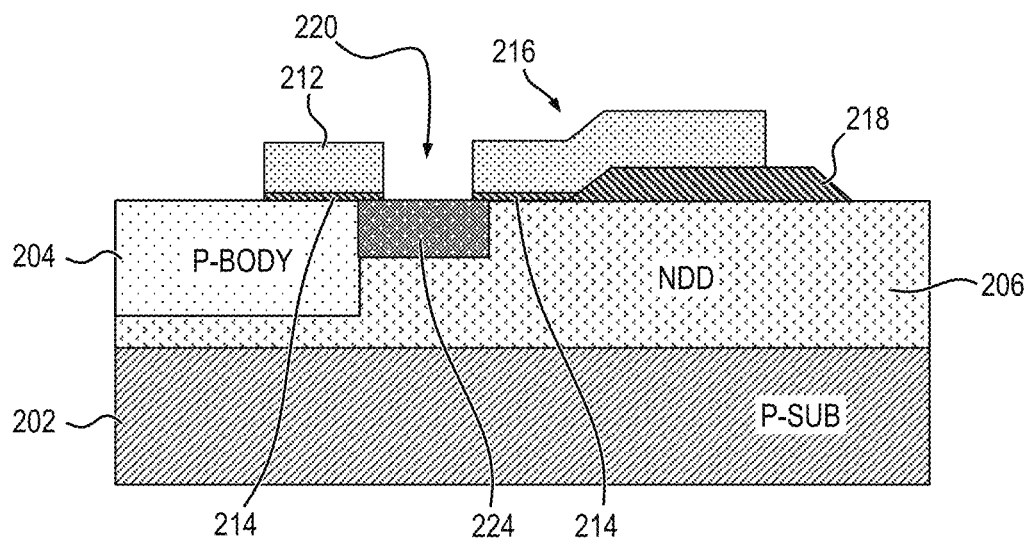

In FIG. 6C, a thin insulating (gate oxide) layer 214 is formed, such as by oxidizing the wafer. As previously stated, the gate oxide layer 214 has a thickness that is less than a thickness of the high-voltage insulating layer 218. The chemical reaction between oxygen and silicon to generate $SiO_2$ forming the high-voltage insulating layer 218 and gate oxide layer 214 is typically driven by a high-heat environment (e.g., about 800 degrees Celsius (° C.) to 1200° C.); however, even at room temperature, a shallow layer of native oxide (e.g., about 1 nanometer (nm) thick) can form in an air environment. In order to grow thicker oxides in a controlled environment, several known methods can be used, such as, for example, plasma-enhanced chemical vapor deposition (PECVD).

A layer of polysilicon is then deposited on at least a portion of the upper surface of the wafer, particularly over the high-voltage insulating layer 218 and gate oxide layer 214. The polysilicon layer, after patterning and etching, will form the gate 212 and field plate 216 structures of the LDMOS device 200. As previously described, the field plate 216, which in this exemplary embodiment is essentially an extension of the gate 212, is configured having at least one opening 220 therein which serves to reduce the parasitic gate-to-drain overlap capacitance $C_g a$.

With continued reference to FIG. 6C, a doped body region 204 is formed in a portion of the NDD region 206, proximate the upper surface of the NDD region. In this example, the body region 204 is doped with an impurity having a conductivity type opposite to the conductivity type of the NDD region (i.e., a p-type impurity), and thereby forms a p-body of the LDMOS device 200. The body region 204 is preferably formed using an implant process, such as, for example, ion implantation, often followed by annealing at a prescribed temperature to drive and distribute the impurity in the NDD region 206. An inversion layer or channel is established in the body region 204 under the gate oxide layer 214 of the LDMOS device 200 upon application of a prescribed bias voltage (e.g., at least equal to a threshold voltage, $V_t$, of the LDMOS device) between a gate and source region (212 and 208, respectively, in FIG. 2). The channel is operative to facilitate a flow of current between the source and drain regions in the LDMOS device 200 as a function of the applied bias voltage.

Optionally, an implant layer 224 is formed in the NDD region 206, proximate the upper surface of the NDD region, underlying the opening 220 between the gate 212 and the field plate 216. During implantation, the gate 212 and field plate 216 are preferably used as a mask. As previously explained, the implant layer 224, which in this exemplary embodiment is an n-type implant layer, serves to increase the n-type doping concentration level at the edge of the channel closest to the drain region 210, thereby reducing the on-resistance of the LDMOS device. The implant layer 224 also serves to limit the channel region under the gate 212 for improved high-frequency performance.

Figure 6D:
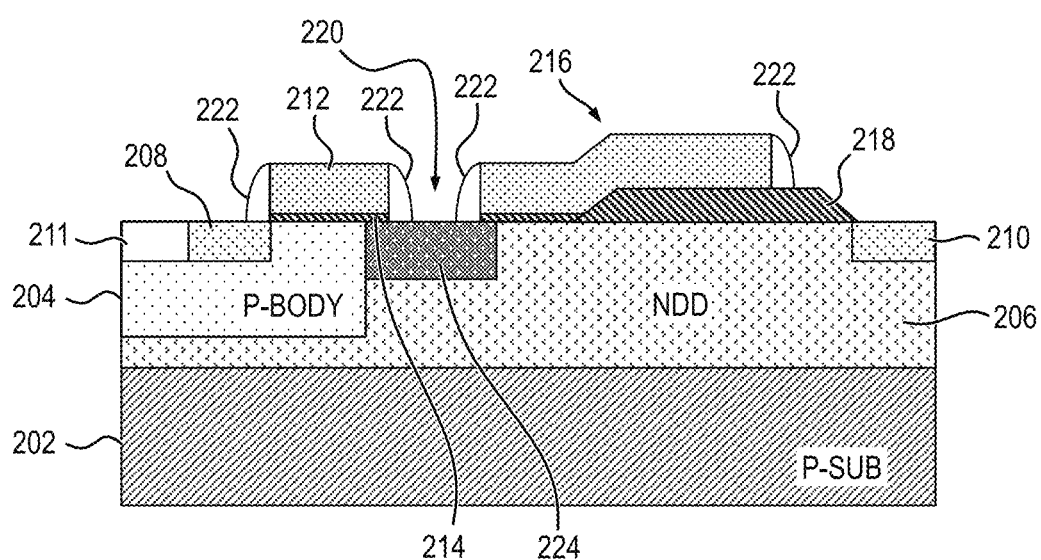

In FIG. 6D, insulating spacers 222 are formed on sidewalls of the gate 212 and field plate 216. Additionally, a source region 208 and drain region 210 are formed, such as by using an implant process (e.g., ion implantation) to introduce impurities of a prescribed concentration level and type, followed by a diffusion step to facilitate distribution of the dopant. The source and drain regions 208, 210 are preferably formed proximate the upper surface of the body region 204 and NDD region 206, respectively, and are spaced laterally from one another. A heavily-doped region 211, which is preferably of p-type conductivity in this example and serves as a body contact, is formed adjacent to the source region 208 using an implantation process.

Figure 6E:
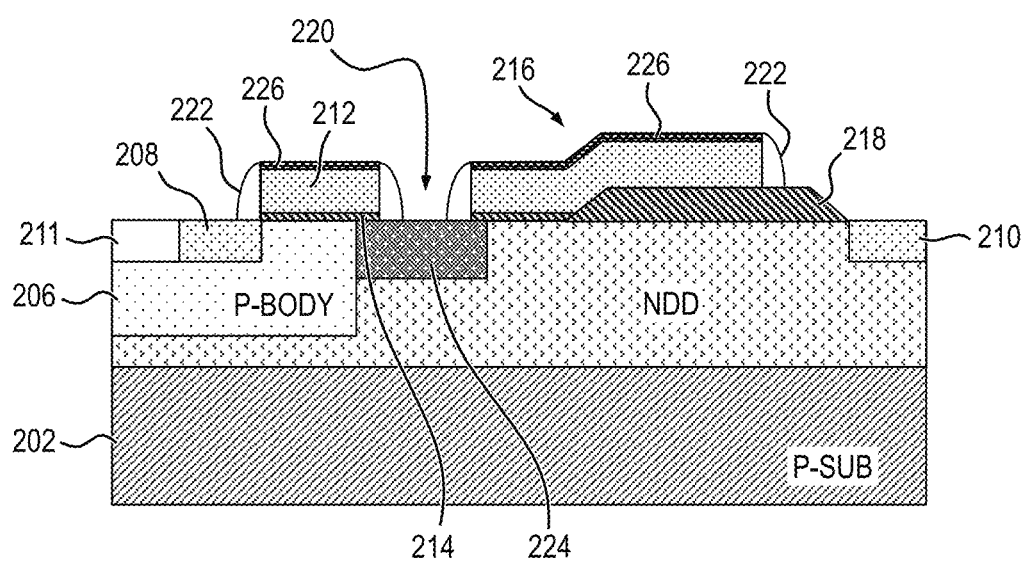

Referring now to FIG. 6E, a layer of silicide 226 is formed on the upper surfaces of the gate 212 and field plate 216 to thereby reduce the resistance of these structures. As will be known by those skilled in the art, a silicide is typically formed by depositing a metal on the upper surface of a silicon structure, followed by a high-temperature anneal (e.g., about 900 degrees Celsius) which converts the deposited metal into the silicide layer. Silicide layers 226 are only formed in those areas in which the deposited metal (which after annealing becomes a metal component of the silicide) is in direct contact with silicon, and thus the process is self-aligned. After silicide formation is complete, BEOL processing is preferably performed for interconnecting individual devices (e.g., transistors, capacitors, resistors, etc.) with wiring on the wafer, the metallization layer, as will be known by those skilled in the art.

Figure 7A:
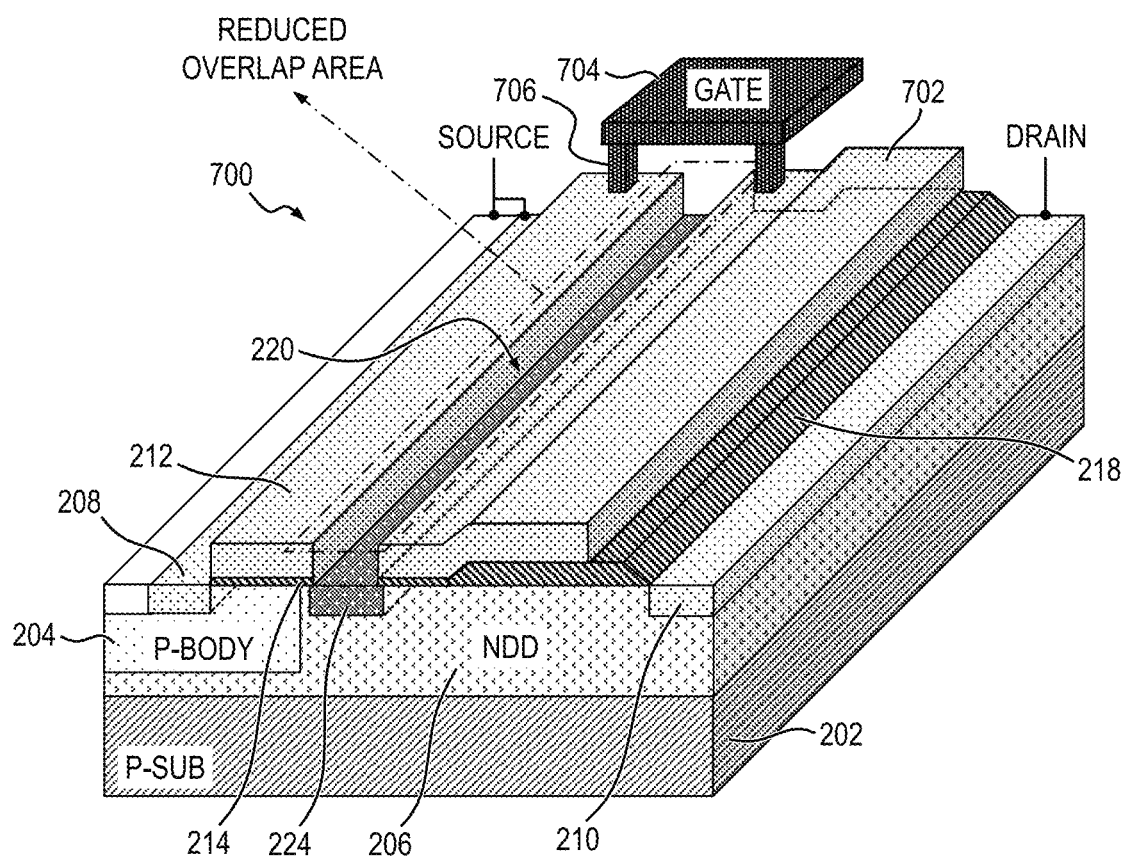
FIG. 7A is a perspective view depicting at least a portion of an exemplary LDMOS device including a field plate formed as a separate structure from the gate, according to an embodiment of the present invention.

FIG. 7A is a perspective view depicting at least a portion of an exemplary LDMOS device 700 including an enhanced field plate structure, according to an alternative embodiment of the invention. Specifically, the LDMOS device 700 is configured in a manner consistent with the illustrative LDMOS device 200 shown in FIG. 2, except that rather than having a field plate (216 in FIG. 2) formed as an extension of the gate 212, the LDMOS device 700 includes a shielding structure 702 that is formed as a separate structure from the gate 212. Compared with the field plate configuration shown in FIG. 2, the separation of the shielding structure 702 from the gate 212 further reduces parasitic gate-to-drain capacitance in the LDMOS device 700. Furthermore, with the shielding structure 702 configured as a separate structure from the gate 212, the shielding structure need not be formed of the same material as the gate.

In this exemplary embodiment, the shielding structure 702 is electrically connected to the gate 212 by way of a gate electrode 704 and corresponding conductive vias 706. The conductive vias 706 are configured to provide direct electrical connection between the gate electrode 704 and respective ends of the gate 212 and shielding structure 702. In one or more embodiments, the ends of the gate 212 and shielding structure 702 distal to the conductive vias 706 are left electrically open (i.e., unconnected). Moreover, the conductive vias 706 are adapted to vertically separate the gate electrode 704 from the NDD region 206, thereby further reducing parasitic gate-to-drain capacitance. The gate electrode 704 and conductive vias 706 may be formed of metal (e.g., aluminum gate electrode and tungsten vias), although embodiments of the invention are not limited to any specific conductive material. Furthermore, the gate electrode 704 and conductive vias 706 need not be formed of the same material.

Preferably, in one or more embodiments, the gate electrode 704 and/or conductive vias 706 are formed of a high-impedance material. Forming the gate electrode 704 and/or the conductive vias 706 of a high-impedance material minimizes drain electrode voltage spikes coupled onto the gate 212 at high switching frequencies, and thereby helps reduce the likelihood of shoot-through as a result of false gate turn-on, which can often occur in a high-frequency power switching application.

In this embodiment, the gate and shielding structure are configured as parallel independent fingered structures. Since the shielding structure 702 is only electrically connected with the gate 212, through the gate electrode 704 and conductive vias 706, at the ends of the gate and shielding structure fingers, the amount of electrical coupling of the gate on the NDD region 206, and hence the parasitic gate-to-drain capacitance, is significantly reduced.

Figure 7B:
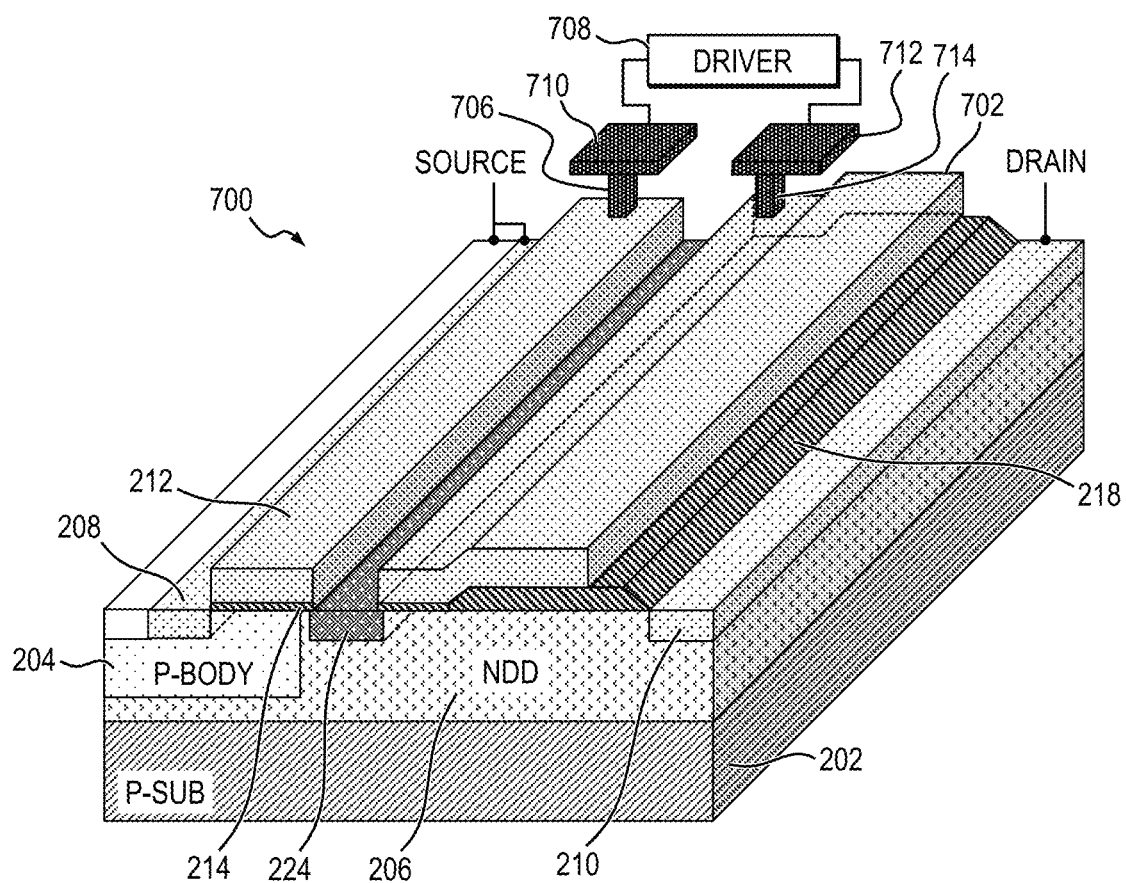
FIG. 7B is a perspective view depicting the exemplary LDMOS device shown in FIG. 7A including a connection to an external gate driver circuit, according to an embodiment of the present invention.

In an alternative embodiment, the gate 212 and shielding structure 702 are electrically connected together through an external circuit. Specifically, FIG. 7B is a perspective view depicting the exemplary LDMOS device 700 shown in FIG. 7A including a connection with an external gate driver circuit 708, according to an embodiment of the invention. In this exemplary embodiment, the gate electrode (704 in FIG. 7A) is split into a gate electrode 710 and a shielding structure electrode 712 which are physically and electrically separated from one another. The gate electrode 708, like the gate electrode 704 depicted in FIG. 7A, is electrically connected with the gate 212 through a corresponding conductive via 706. Similarly, the shielding structure electrode 712 is electrically connected with the shielding structure 702 through its corresponding conductive via 714.

With continued referenced to FIG. 7B, an external gate driver circuit 708 is coupled between the gate electrode 710 and the shielding structure electrode 712. In one or more embodiments, in addition to supplying control signals for independently driving the gate 212 and shielding structure 702, the gate driver circuit 708 provides a high-impedance (e.g., about 1000 ohms) electrical connection between the gate 212 and the shielding structure 702. As previously stated, one benefit of this high-impedance connection arrangement is to minimize drain voltage spikes that may be coupled onto the gate 212 at high switching frequencies leading to false gate turn-on, which helps reduce the likelihood of shoot-through; that is, the shorting of the high voltage supply to ground through high-side and low-side MOSFETs when both devices are on.

Figure 8:
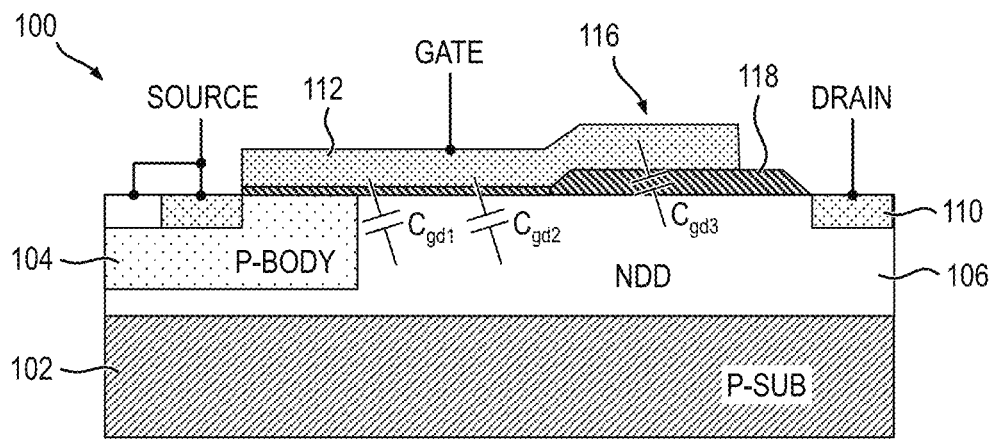
FIG. 8 is a cross-sectional view of the illustrative LDMOS device shown in FIG. 1A, conceptually depicting certain parasitic capacitance components associated therewith.
Figure 9:
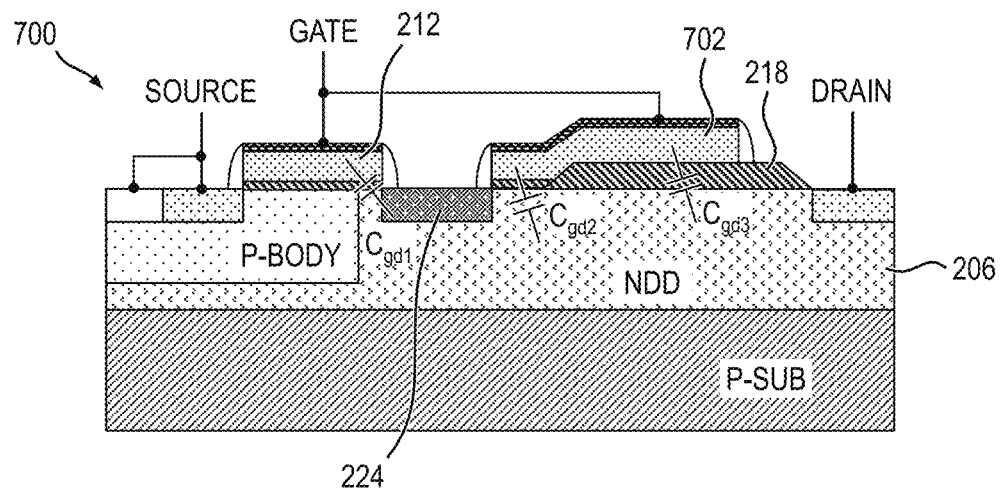
FIG. 9 is a cross-sectional view of the illustrative LDMOS device shown in FIG. 7A, conceptually depicting certain parasitic capacitance components associated therewith.

FIG. 8 is a cross-sectional view of the illustrative LDMOS device 100 shown in FIG. 1A, conceptually depicting parasitic capacitance components associated with the gate 112 and field plate 116. By way of comparison only, FIG. 9 is a cross-sectional view of the illustrative LDMOS device 700 shown in FIG. 7A, conceptually depicting parasitic capacitance components associated with the gate 212 and shielding structure 702.

More particularly, with reference to FIG. 8, the LDMOS device 100 includes parasitic gate-to-drain capacitance components $C_{gd1}$, $C_{gd2}$ and $C_{gd3}$ introduced as a result of the extension of the gate 112 and field plate 116 over the NDD region 106. The capacitance of $C_{gd3}$ will be less than $C_{gd2}$ due, at least in part, to the thicker dielectric layer 118 on which the field plate 116 is formed. The distributed parallel capacitance components $C_{gd1}$, $C_{gd2}$ and $C_{gd3}$ will be summed together to contribute to the total gate-to-drain capacitance in the LDMOS device 100. By comparison, with the novel configuration of the shielding structure 702 shown in FIG. 9, the components of parasitic gate-to-drain capacitance present in the LDMOS device 700 is $C_{gd1}$, attributable to the slight electrical coupling of an edge of the gate 212 on the NDD region 206, $C_{gd2}$, attributable to the slight overlap of an edge of the shielding structure 702 on the NDD region, and $C_{gd3}$, attributable to the extension of the shielding structure over the NDD region. However, since a large portion of the gate extension over the NDD region has been removed in the LDMOS device 700, these parasitic gate-to-drain capacitance contributions will be significantly smaller in the LDMOS device 700 compared to corresponding parasitic capacitance components in the LDMOS device 100 of FIG. 1A. Moreover, given that gate-to-drain capacitance is a primary source of switching induced gate false turn on in an LDMOS device, the LDMOS device 700 will beneficially achieve enhanced device reliability at higher switching frequencies compared to the LDMOS device 100.

In order to reduce the parasitic capacitance introduced by the extension of the field plate 216 (see FIG. 2) over the NDD region 206, the thickness of the insulating layer 218 between the field plate (i.e., shielding structure 702 in FIGS. 7A and 7B) and the NDD region is increased, as previously described. The insulting layer 218 shown in FIGS. 2-7B is preferably formed using an oxidation process or an oxide deposition process, in embodiments of the invention. To be more compatible with current semiconductor process platforms, FIGS. 10 and 11 illustrate alternative embodiments for forming the high-voltage insulating layer underlying the field plate 216.

Figure 10:
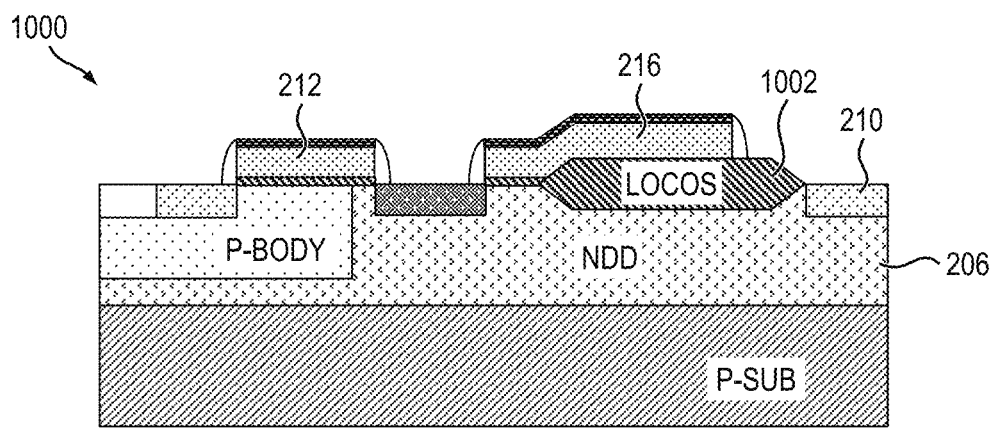
FIG. 10 is a cross-sectional view depicting at least a portion of an exemplary LDMOS device consistent with the illustrative LDMOS devices shown in FIGS. 2-7B, with the thick insulating layer replaced by a local oxidation of silicon (LOCOS) structure, according to an embodiment of the present invention.

Specifically, FIG. 10 is a cross-sectional view depicting at least a portion of an exemplary LDMOS device 1000 formed in a manner consistent with the illustrative LDMOS devices shown in FIGS. 2-7B, with the high-voltage insulating layer (218 in FIGS. 2, 7A and 7B) replaced by a local oxidation of silicon (LOCOS) structure 1002, according to an embodiment of the invention. As will be known by those skilled in the art, during LOCOS processing, areas of the wafer not meant to be oxidized are coated in a material (e.g., silicon nitride) that prevents diffusion of oxygen at high temperatures (e.g., about 800 to 1200° C.). The LOCOS structure 1002 is formed, in one or more embodiments, by thermal oxidation of silicon in the NDD region 206. During this high-temperature process, the silicon wafer is "consumed" and "replaced" by silicon oxide. The field plate 216 is then formed on at least a portion of the LOCOS structure 1002 in a manner consistent with the formation of the field plate 216 on the high-voltage insulating layer 218 shown in FIG. 2.

Figure 11:
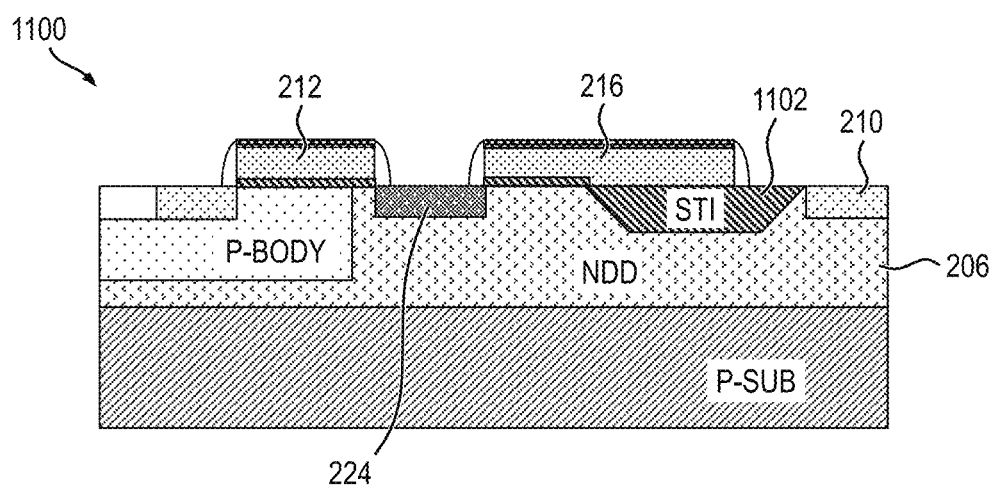
FIG. 11 is a cross-sectional view depicting at least a portion of an exemplary LDMOS device consistent with the illustrative LDMOS devices shown in FIGS. 2-7, only with the thick insulating layer replaced by a shallow trench isolation (STI) structure, according to an embodiment of the present invention.

Similarly, FIG. 11 is a cross-sectional view depicting at least a portion of an exemplary LDMOS device 1100 formed in a manner consistent with the illustrative LDMOS devices shown in FIGS. 2-7B, with the high-voltage insulating layer (218 in FIGS. 2, 7A and 7B) replaced by a shallow trench isolation (STI) structure 1102, according to an embodiment of the invention. As will be known by those skilled in the art, an STI structure 1102 is created early during the semiconductor device fabrication process, before transistors and other active components are formed. In one or more embodiments, the STI structure 1102 is formed by etching a trench in a portion of the NDD region 206 (between the implant layer 224 and the drain region 210), depositing one or more dielectric materials (e.g., silicon dioxide) to fill the trenches, and removing the excess dielectric material using a planarization technique such as, for example, CMP. The field plate 216 is then formed on at least a portion of the STI structure 1102 in a manner consistent with the formation of the field plate 216 on the high-voltage insulating layer 218 shown in FIG. 2; however, because the STI structure 1102 is substantially planar with the upper surface of the wafer, the field plate 216 will be formed over the NDD region 206 such that it is substantially planar with the gate 212; that is, the field plate will not be a stepped structure like the field plate shown in FIG. 2, 7A or 7B.

Aspects according to embodiments of the present invention may be beneficially employed in forming a high-value capacitor in a substantially small footprint. This is well-suited for applications such as, but not limited to, a switching direct current (DC)-DC synchronous converter, which typically requires a relatively high-value input capacitor to improve a switching voltage ringing problem which commonly plagues switching DC-DC synchronous converters.

Figure 12:
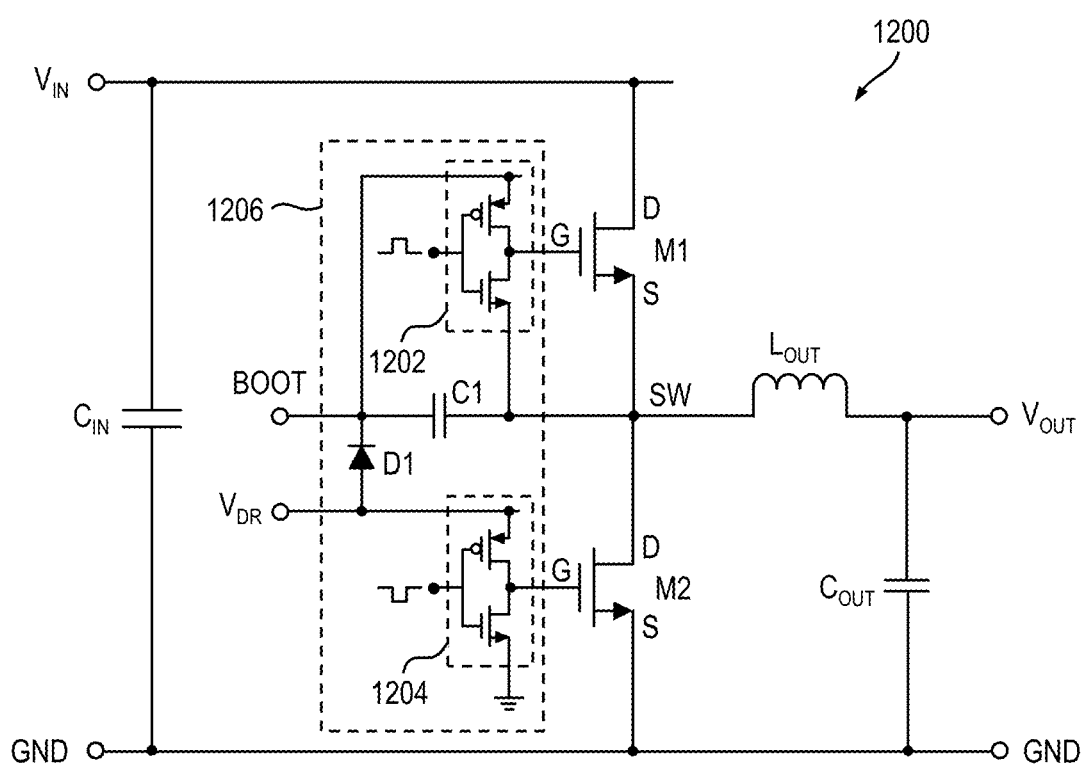
FIG. 12 is an electrical schematic diagram depicting at least a portion of an exemplary switching DC-DC voltage regulator circuit in which aspects according to one or more embodiments of the present invention may be utilized.

By way of example only and without limitation or loss of generality, FIG. 12 is an electrical schematic diagram depicting at least a portion of an exemplary switching DC-DC voltage converter circuit 1200, implemented as a synchronous buck converter, in which aspects according to one or more embodiments of the invention may be utilized. The voltage converter circuit 1200 includes a first MOSFET device, M1, which may be referred to herein as a high-side device, and a second MOSFET device, M2, which may be referred to herein as a low-side device. A drain (D) of the high-side device M1 is connected to an input voltage, $V_{IN}$, a source (S) of M1 is connected to an output switching node, SW, and a gate (G) of M1 is connected to a first driver circuit 1202. A drain of the low-side device M2 is connected to the output switching node SW, a source of M2 is connected to ground, or an alternative voltage return of the circuit 1200, and a gate of M2 is connected to a second driver circuit 1204.

The first and second driver circuits 1202, 1204 form part of a controller circuit 1206 for generating first and second control signals supplied to the gates of the MOSFET devices M1 and M2, respectively. The first driver circuit 1202 is coupled between the switching node SW and a boot supply voltage, BOOT, and the second driver circuit 1204 is coupled between a driver supply voltage, $V_{DR}$, and ground. Each of the driver circuits 1202, 1204 may be implemented using an inverter, in one or more embodiments. The driver supply voltage, $V_{DR}$, is preferably supplied to the second driver circuit 1204, and the boot supply voltage, BOOT, is preferably supplied to the first driver circuit 1202. A diode, D1, is connected having an anode coupled with the driver supply voltage $V_{DR}$, and having a cathode connected to the boot supply voltage BOOT. A capacitor, C1, is preferably connected between the boot supply voltage BOOT and the switching node SW. Together, diode D1 and capacitor C1 form a bootstrap circuit, which is used to generate a high enough voltage $V_{GS}$ to turn on the N-channel MOSFET completely as a high-side switch, which is generally required when an N-channel MOSFET is used for the high-side transistor of the converter circuit 1200.

The DC-DC converter circuit 1200 further includes an input capacitor, $C_{IN}$, connected between the input voltage $V_{IN}$ and ground, and an output capacitor, $C_{OUT}$, connected between a regulated output voltage, $V_{OUT}$, and ground. An output inductor, $L_{OUT}$, coupled between the switching node SW and an output of the converter circuit 1200 is used to generate the regulated output voltage $V_{OUT}$. Together, the inductor L1 and output capacitor $C_{OUT}$ function as energy storage elements of the converter circuit 1200.

Usually, the input capacitor Cir is located on a printed circuit board (PCB) which is far from the switching devices M1 and M2 in the DC-DC converter circuit, and therefore parasitic effects are often severe. Consequently, a preferred approach is to integrate the input capacitor Cir on the silicon wafer, thereby keeping the distance between the input capacitor and the switching devices as short as possible. Conventionally, an integrated input capacitor $C_{IN}$ is typically formed as a metal-insulator-metal (MIM) capacitor. While this approach may help reduce parasitic capacitance, MIM capacitors require significant area on the wafer to achieve the value of capacitance typically required in the DC-DC converter, and furthermore require an additional mask step, which is undesirable.

Figure 13:
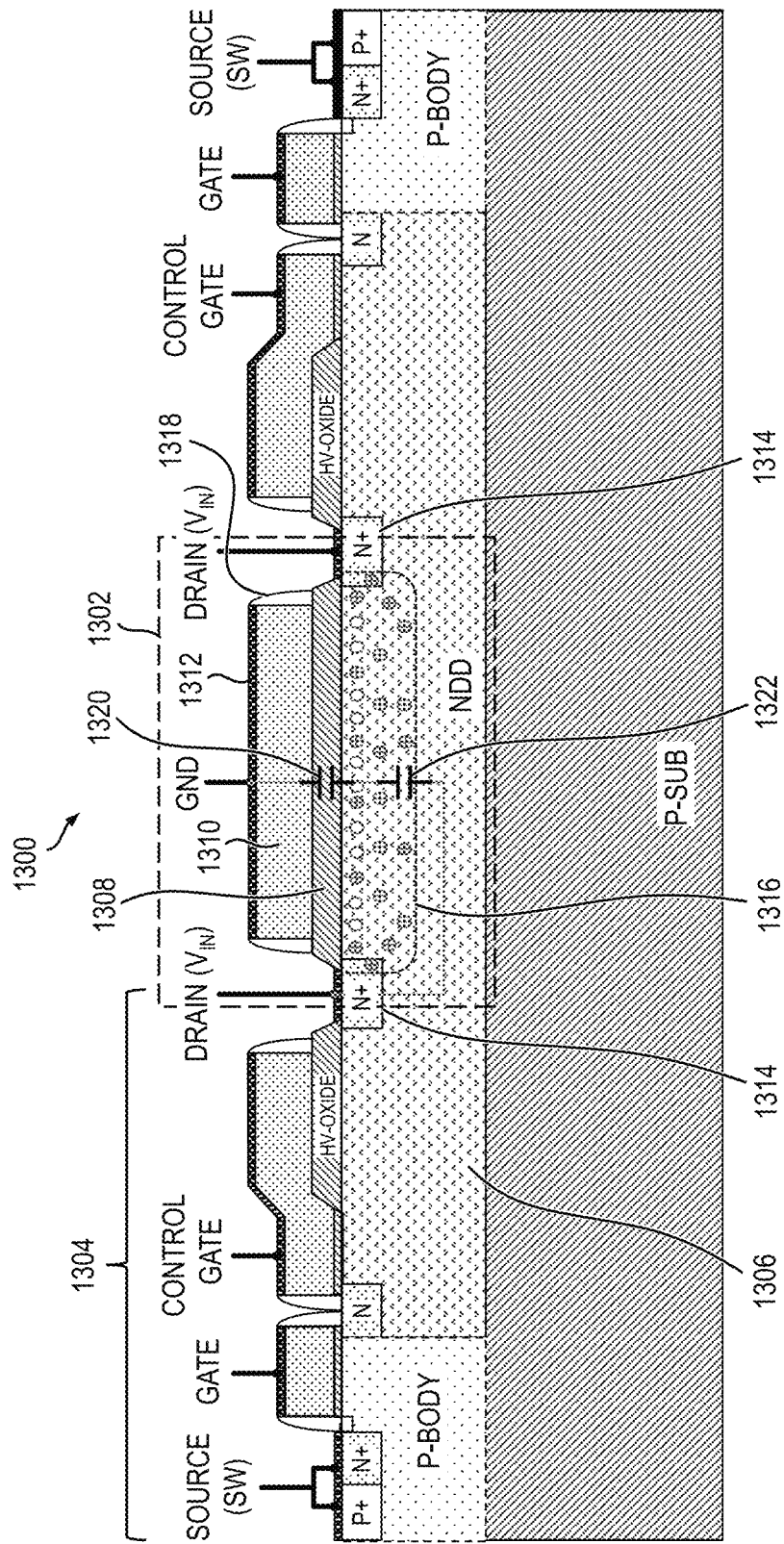
FIG. 13 is a cross-sectional view depicting at least a portion of an exemplary semiconductor structure comprising an input capacitor embedded with a high-side MOSFET device of a DC-DC converter, according to one or more embodiments of the present invention.

In order to overcome disadvantages of the standard approach, one or more embodiments of the invention beneficially integrates an input capacitor with one or both primary switching devices, such as embedding the input capacitor directly into the drain of the high-side MOSFET device M1 or into the source of the low-side MOSFET device M2, or both. FIG. 13 is a cross-sectional view depicting at least a portion of an exemplary semiconductor structure 1300 comprising an input capacitor 1302 embedded with a high-side MOSFET device 1304 of a DC-DC converter, according to one or more embodiments of the invention. In this illustration, it is assumed that the high-side MOSFET device 1304 is turned on, such as, for example, by applying a voltage potential between the gate and source terminals of the MOSFET device that is greater than a threshold voltage ($V_T$) of the device, as will be appreciated by those skilled in the art. As shown in FIG. 13, the input capacitor 1302, in this illustrative embodiment, is implemented as a polysilicon-oxide-silicon (POS) capacitor formed in an NDD region 1306 of the high-side MOSFET device 1304.

The input capacitor 1302 includes an insulating layer 1308, which in this embodiment preferably comprises an oxide, formed on an upper surface of at least a portion of the NDD region 1306, and a polysilicon layer 1310 formed on at least a portion of an upper surface of the oxide layer 1308. The polysilicon layer 1310 forms a first plate of the input capacitor 1302 and the NDD region 1306 forms a second plate of the input capacitor.

In undergoing an optional silicide process, whereby a metal silicide is deposited on an upper surface of the wafer, a silicide layer 1312 may be formed on at least a portion of an upper surface of the polysilicon layer 1310 to provide a low-resistance connection to the polysilicon layer. Other portions of the structure 1300, such as, for example, gate and control gate polysilicon and source and drain regions of the MOSFET device, may also be silicided.

With continued reference to FIG. 13, one or more drain regions 1314 of the high-side MOSFET device 1304 are formed in the NDD region 1306 proximate an upper surface of the NDD region. In this illustrative embodiment, the drain region 1314 is doped with an n-type impurity to form an N+ drain region, although embodiments of the invention contemplate that a p-type drain region may be similarly employed. The insulating layer 1308 is formed between the drain regions 1314. The drain regions 1314 may be electrically coupled together via a metal connection (e.g., M1 connection layer), not explicitly shown but implied. Depending on the difference in voltage potential between the polysilicon layer 1310 and the drain region(s) 1314, a depletion region 1316 will form in the NDD region 1306 proximate the upper surface of the NDD region and between the drain regions 1314. Dielectric spacers 1318 are preferably formed on sidewalls of the polysilicon layer 1310 which serve to electrically isolate the input capacitor 1302 from other circuit elements formed on the common substrate (P-SUB).

Figure 14:
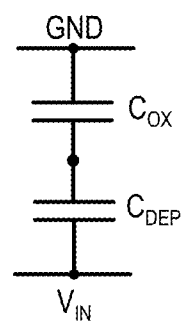
FIG. 14 is an electric schematic diagram conceptually depicting an equivalent circuit for the illustrative embedded input capacitor shown in FIG. 13, according to one or more embodiments of the present invention.

The drain regions 1314 of the high-side MOSFET device 1304 are adapted to receive an applied input voltage ($V_{IN}$), and the polysilicon layer 1310 of the input capacitor 1302 is preferably connected to ground (GND). Configured in this manner, the input capacitor 1302 ($C_{IN}$) will comprise two primary capacitance components connected together in series; namely, an oxide capacitance ($C_{OX}$) 1320 and a depletion capacitance ($C_{DEP}$) 1322. An equivalent circuit of the input capacitor 1302 is shown in FIG. 14. With the two capacitance components connected in series, the total capacitance, $C_{TOT}$, of the input capacitor 1302 can be determined using the following expression:

$$C_{TOT} = \frac{C_{OX} \cdot C_{DEP}}{C_{OX} + C_{DEP}}, \quad (1)$$

As can be seen from expression (1) above, the total capacitance of the input capacitor $C_{IN}$ 1302 shown in FIG. 13 will be much smaller than either capacitance component $C_{OX}$ or $C_{DEP}$ individually. Therefore, in order to increase the total capacitance of the input capacitor $C_{IN}$ 1302, the semiconductor structure 1300 can be modified in accordance with aspects of the invention to effectively short out the depletion capacitance component, such that $C_{IN} \approx C_{OX}$. To accomplish this, one or more doped regions having a conductivity type opposite the conductivity type of the drain regions 1314 are preferably formed and connected to the drain regions, as depicted in FIG. 15.

Figure 15:
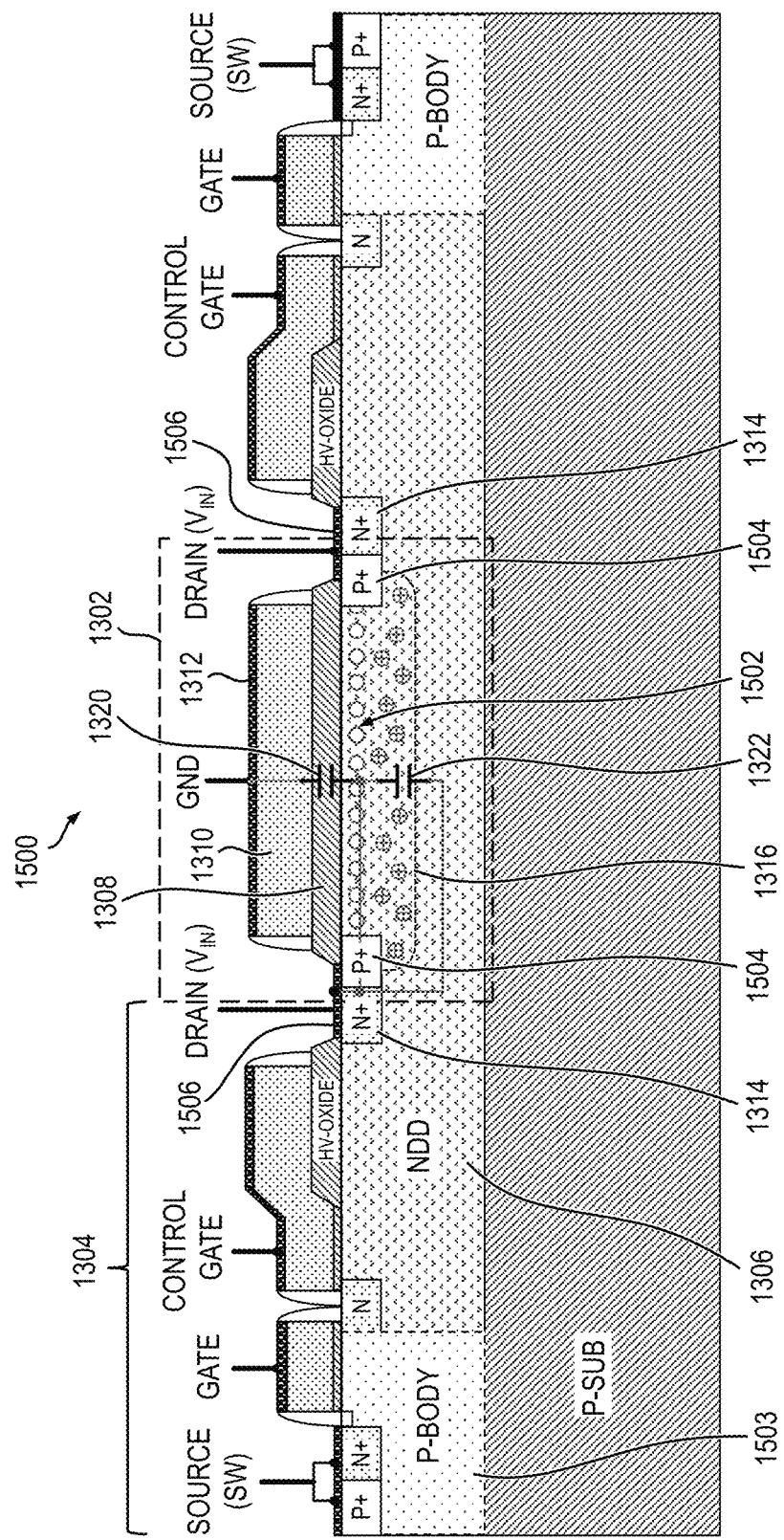
FIG. 15 is a cross-sectional view depicting at least a portion of an exemplary semiconductor structure which is consistent with the illustrative structure shown in FIG. 13 but modified to increase a capacitance of the input capacitor embedded with the high-side MOSFET device, according to one or more embodiments of the present invention.

More particularly, FIG. 15 is a cross-sectional view depicting at least a portion of an exemplary semiconductor structure 1500, which is consistent with the structure 1300 shown in FIG. 13 but modified to increase a capacitance of the input capacitor 1302 embedded with the high-side MOSFET device 1304, according to one or more embodiments of the invention. Like the structure 1300 shown in FIG. 13, it is assumed that the high-side MOSFET device 1304 is turned on, such as by applying a voltage potential between the gate and source terminals that is greater than a threshold voltage of the device.

As shown in FIG. 15, an inversion layer 1502 is formed in the NDD region 1306, proximate the upper surface of the NDD region and below at least a portion of the insulating layer 1308 of the input capacitor 1302. The characteristics of the inversion layer 1502 will depend upon multiple parameters, including the doping concentration of the NDD region proximate the interface between the insulating layer 1308 and the NDD region 1306, as well as the applied bias voltage between the polysilicon layer 1310 and the NDD region. In this illustrative embodiment, the inversion layer 1502 comprises holes induced by an applied bias voltage. In one or more embodiments, the concentration of the inversion layer 1502 can reach about $5 \times 10^{17}$-$5 \times 10^{19}$ atoms per cubic centimeter ($cm^{-3}$), although embodiments of the invention are not limited to any specific concentration level. The concentration of the inversion layer 1502 will vary primarily as a function of the level of applied bias voltage. The NDD region 1306 is preferably doped with an n-type impurity at a doping concentration level of about $5 \times 10^{15}$-$1 \times 10^{18}$ $cm^{-3}$, although embodiments of the invention are not limited to any specific impurity type or doping concentration level. Doping may be achieved using a standard implant process (e.g., ion implantation) or similar. Compare the doping concentration level of the NDD region 1306 with an illustrative doping concentration of a body region 1503, a p-type body region (P-body) in this illustrative embodiment, in which a source region of the MOSFET device 1304 is formed, which has a doping concentration level of about $5 \times 10^{16}$-$5 \times 10^{18}$ $cm^{-3}$.

As in p-n junctions, the governing principle in the formation of depletion and inversion layers is charge neutrality. If the NDD region 1306 is an n-type doping, then electrons are depleted to a depth w exposing sufficient positive donors to exactly balance the charge on the polysilicon layer 1310. Supposing the dopant density to be $N_D$ donors per unit volume, then charge neutrality requires the depletion width w to satisfy the relationship:

$$Q = qN_D w,$$

where q is electron charge.

If the depletion width w becomes wide enough, then holes appear in a very thin layer at the semiconductor-oxide interface, called an inversion layer because they are oppositely charged to the electrons that prevail in the n-type NDD region 1306. When the inversion layer forms, the depletion width ceases to expand with increasing charge Q. In this case, neutrality is achieved by attracting more holes into the inversion layer. In the MOSFET device, this inversion layer is referred to as the channel.

One or more doped regions 1504, preferably of p-type conductivity (P+) in this illustrative embodiment, are formed in the NDD region 1306 proximate the upper surface of the NDD region at opposing ends of the inversion layer 1502, and adjacent to corresponding drain regions 1314. The doped regions 1504, which may be formed using a standard implant process or the like, serve as a pick-up for providing electrical connection between the inversion layer and the adjacent drain regions 1314. The doped regions 1504 are required primarily because the carriers in the inversion layer 1502 are holes and therefore cannot directly connect to the n+ drain regions 1314; a p-n junction barrier exists between the p-type and n-type materials. Therefore, the P+ doped regions 1504 are electrically connected to the inversion layer 1502. Each of the doped regions 1504 preferably has a conductivity type that is opposite the conductivity type of the drain regions 1314 (e.g., P+ doped regions in this illustrative embodiment) and is electrically connected to the adjacent drain regions through a silicide layer 1506 formed on at least a portion of an upper surface of the respective drain and doped regions, although alternative arrangements for electrically connecting the doped and drain regions are similarly contemplated. In one or more embodiments, a doping concentration level of the doped regions 1504 is about $10^{18}$-$10^{21}$ cm$^{-3}$.

Figure 16:
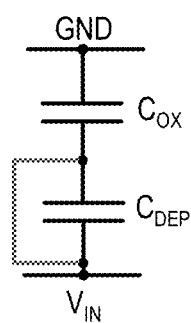
FIG. 16 is an electric schematic diagram conceptually depicting an equivalent circuit for the illustrative embedded input capacitor shown in FIG. 15, according to one or more embodiments of the present invention.

With continued reference to FIG. 15, the formation of the P+ doped regions 1504 connected to the drain regions 1314 creates a current path from the inversion layer 1502 to the drain regions 1314, which in turn are connected to the input voltage $V_{IN}$. Configured in this manner, the depletion capacitance component $C_{DEP}$ 1322 will effectively be bypassed (i.e., shorted out), thereby leaving only the oxide capacitance component $C_{OX}$ 1320 connected between the input $V_{IN}$ (i.e., the drain of the high-side MOSFET device) and ground. An equivalent input capacitor circuit conceptually illustrating this arrangement is shown in FIG. 16. Hence, the total input capacitance $C_{IN}$ will be nearly equivalent to the oxide capacitance $C_{OX}$ (i.e., $C_{IN} \approx C_{OX}$), which is advantageously much larger than the total input capacitance as defined by expression (1) above, which takes into account the depletion capacitor.

Figure 17:
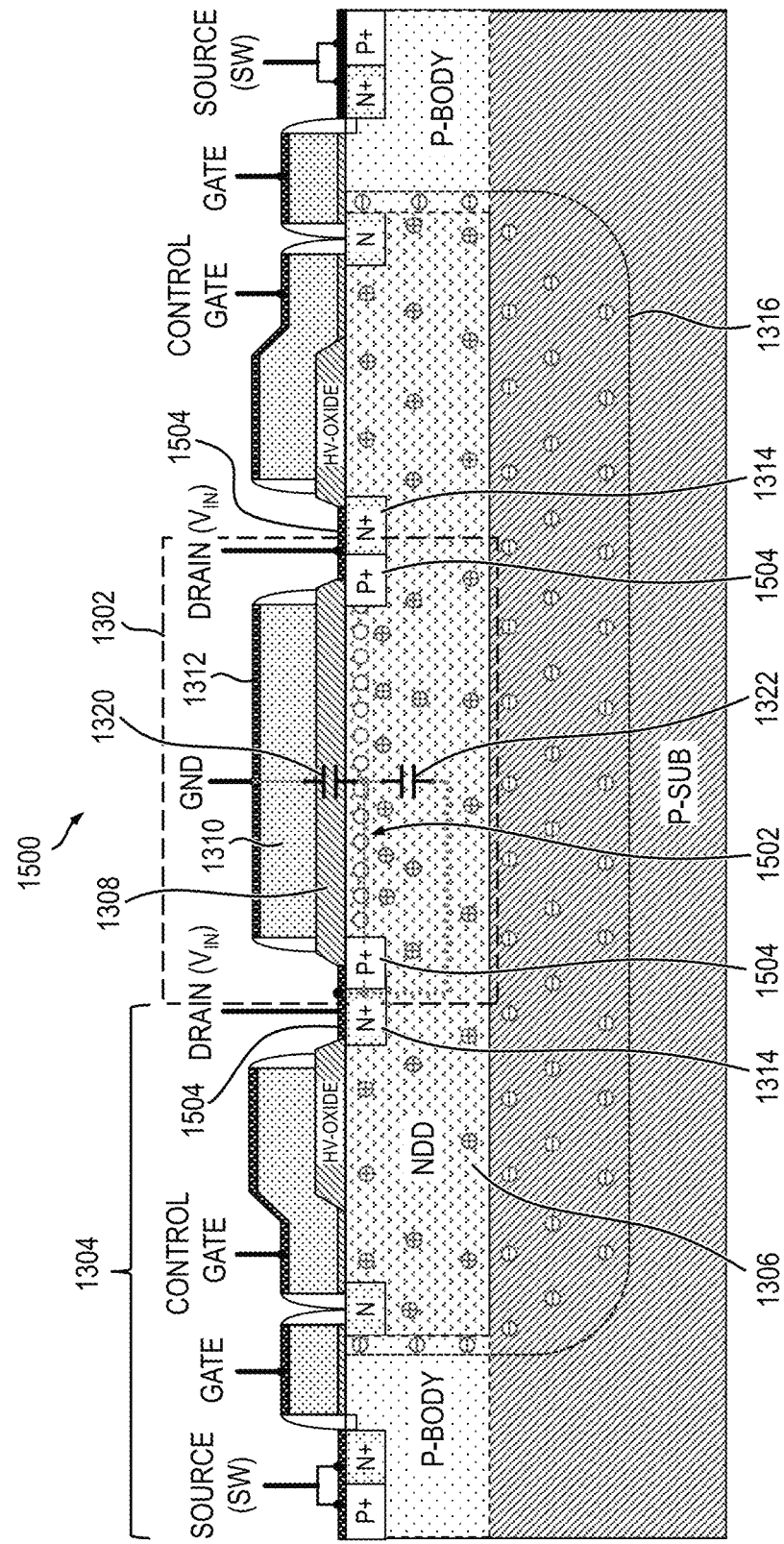
FIG. 17 is a cross-sectional view conceptually depicting at least a portion of the exemplary semiconductor structure shown in FIG. 15, with the high-side MOSFET device turned off, according to one or more embodiments of the present invention.

FIG. 17 is a cross-sectional view conceptually depicting at least a portion of the exemplary semiconductor structure 1500 shown in FIG. 15, with the high-side MOSFET device 1304 turned off, according to one or more embodiments of the invention. As apparent from FIG. 17, the depletion region 1316 with the high-side MOSFET device turned off has expanded vertically into the substrate and laterally to under the polysilicon gates. However, with the input capacitor 1302 biased such that the polysilicon layer 1310 is connected to ground and the drain regions 1314 and P+ doped regions 1504 connected to $V_{IN}$, the inversion layer 1502 will still form below the insulating layer 1308 of the POS capacitor, proximate the upper surface of the NDD region 1306, which provides a current conduction path between the NDD region (forming a bottom plate of the input capacitor 1302) and $V_{IN}$. Furthermore, the depletion capacitance component $C_{DEP}$ 1322 has essentially no conduction path to the drain regions 1314, thereby effectively eliminating $C_{DEP}$ as a contributing factor in the input capacitance $C_{In}$. Thus, regardless of whether the high-side MOSFET device is turned on or off, the total capacitance between $V_{IN}$ and ground will remain nearly equivalent to the oxide capacitance $C_{OX}$ 1320, according to aspects of the invention.

Figure 18:
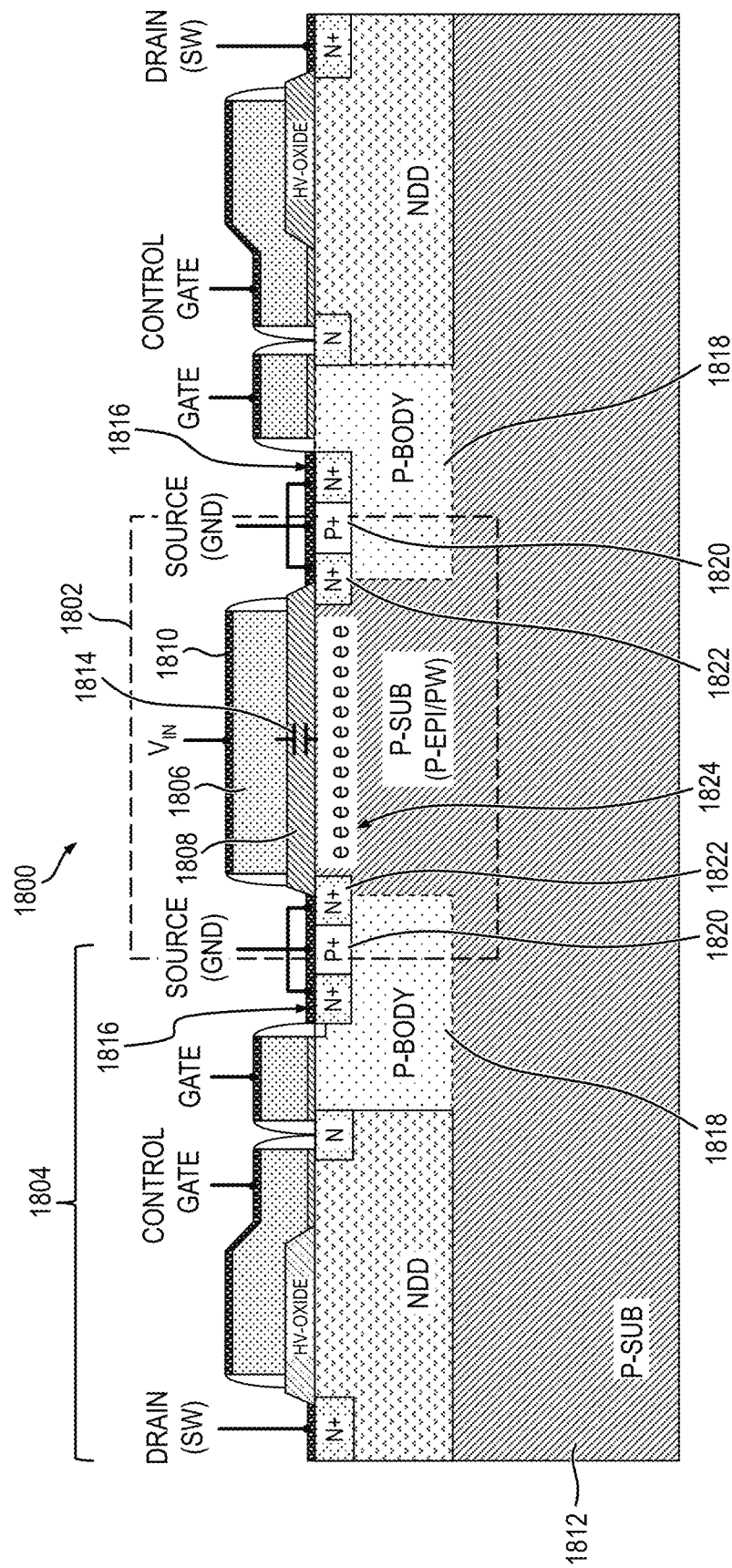
FIG. 18 is a cross-sectional view depicting at least a portion of an exemplary semiconductor structure comprising an input capacitor embedded with a low-side MOSFET device of a DC-DC converter, according to one or more embodiments of the present invention.

The illustrative embodiments previously described in conjunction with FIGS. 13-17 depict semiconductor structures in which an input capacitor $C_{IN}$, or at least a portion thereof, is integrated directly into the high-side MOSFET device (M1 in FIG. 12). In a similar fashion, the input capacitor $C_{IN}$, or at least a portion thereof, can be integrated directly into the low-side MOSFET device (M2 in FIG. 12), according to embodiments of the invention. By way of example only and without limitation, FIG. 18 is a cross-sectional view depicting at least a portion of an exemplary semiconductor structure 1800 comprising an input capacitor 1802 embedded with a low-side MOSFET device 1804 of a DC-DC converter, according to one or more embodiments of the invention. The input capacitor 1802 comprises a polysilicon layer 1806 formed on at least a portion of an upper surface of an insulating layer 1808, which may be an oxide (e.g., SiO$_2$). The polysilicon layer 1806 forms a first plate of the input capacitor 1802. A silicide layer 1810 may be optionally formed on at least a portion of an upper surface of the polysilicon layer 1806 to provide a low-resistance electrical connection to underlying the polysilicon layer.

A semiconductor layer 1812, preferably silicon, underlying the insulating layer 1808 is doped with a p-type material (e.g., boron or aluminum) in this illustrative embodiment, although other embodiments of the invention contemplate that the semiconductor layer may be doped with an n-type material (e.g., phosphorus or arsenic). The semiconductor layer 1812 may be formed as a p-type substrate (P-SUB), or alternatively may be formed as a p-type epitaxial layer (P-EPI) or p-type well (PW), as will become apparent to those skilled in the art. The semiconductor layer 1812 forms a second plate of the input capacitor 1802. Configured in this manner, the polysilicon layer 1806, oxide layer 1808 and semiconductor layer 1812 forms a POS capacitor, shown symbolically as reference numeral 1814. The polysilicon layer 1806 is preferably adapted to receive an applied input voltage, $V_{IN}$, and the semiconductor layer 1812 is connected to ground through one or more source regions 1816 of the low-side MOSFET device 1804.

Each of the source regions 1816 is disposed in a doped body region 1818, which is preferably a p-type body region (P-BODY) in this illustrative embodiment, formed in the semiconductor layer 1812 proximate the upper surface of the semiconductor layer and adjacent to an NDD region in the low-side MOSFET device 1804. In this embodiment, the source regions 1816 have an n-type conductivity (N+), although embodiments of the invention are not limited to an N+ source region. One or more first doped regions 1820 having a conductivity type that is opposite the conductivity type of the source regions 1816, preferably a P+ region in this embodiment, are formed in the body region 1818 proximate the upper surface of the body region and adjacent to the source region. One or more second doped regions 1822 having a conductivity type that is opposite the conductivity type of the first doped regions 1820, preferably an N+ region in this embodiment, are formed partially in the body region 1818 and partially in the semiconductor layer 1812, proximate the upper surface of the body region and semiconductor layer and adjacent to the first doped region. The second doped region 1822 functions as an N+ pick-up which surrounds the polysilicon layer 1806 of the input capacitor 1802. In a manner consistent with the input capacitor 1302 integrated with the high-side MOSFET device shown in FIG. 15, an inversion layer 1824 is formed in the substrate (semiconductor layer) 1812, directly under the insulating layer 1808 of the input capacitor and between the N+ doped regions 1822.

The characteristics of the inversion layer 1824 will depend upon multiple parameters, including the doping concentration of the p-type semiconductor layer 1812 (P-SUB, or P-EPI, or P-WELL) proximate the dielectric layer 1808, as well as the applied bias voltage between the polysilicon layer 1806 and the p-type region (P-SUB, or P-EPI, or P-WELL). In one or more embodiments, the concentration of inversion layer 1824 can reach about $5 \times 10^{17}$-$5 \times 10^{19}$ cm$^{-3}$, although embodiments of the invention are not limited to any specific doping concentration level. The source region 1816, body region 1818, and first and second doped regions 1820 and 1822, respectively, are also preferably formed using a standard implant process, as will be known by those skilled in the art. By way of example only and without limitation, the body region 1818 is preferably doped with an impurity concentration level of about $5 \times 10^{16}$-$5 \times 10^{18}$ cm$^{-3}$, and the second doped (N+) region 1822 is doped at an impurity concentration level of about $10^{18}$-$10^{21}$ cm$^{-3}$, although embodiments of the invention are not limited to any specific impurity type or doping concentration level.

As previously stated, the semiconductor layer 1812 under the input capacitor is not limited to any specific material or conductivity type. For example, although the input capacitor 1802 shown in FIG. 18 is formed having a second plate comprising the p-type substrate 1812 beneath the polysilicon layer 1806, the input capacitor may alternatively be formed having an n-type semiconductor layer underlying the polysilicon layer. More particularly, FIG. 19 is a cross-sectional view depicting at least a portion of an exemplary semiconductor structure 1900 comprising an input capacitor 1902 embedded with the low-side MOSFET device 1804 of a DC-DC converter, the input capacitor comprising an n-type semiconductor layer serving as the second plate of the input capacitor, according to one or more embodiments of the invention.

Figure 19:
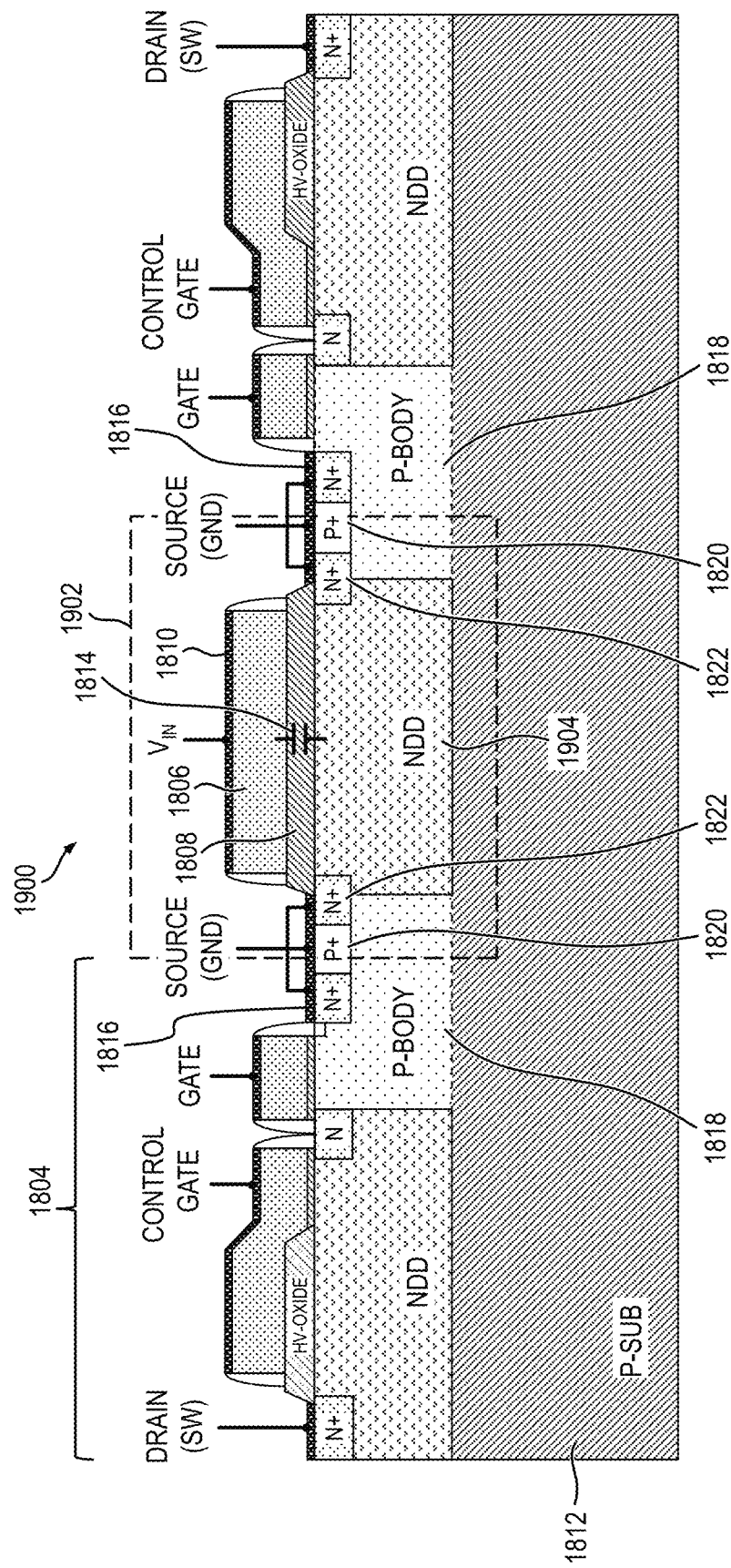
FIG. 19 is a cross-sectional view depicting at least a portion of an exemplary semiconductor structure comprising an input capacitor embedded with the low-side MOSFET device of a DC-DC converter, the input capacitor comprising an n-type semiconductor layer serving as the second plate of the input capacitor, according to one or more embodiments of the present invention.

With reference to FIG. 19, the input capacitor 1902 is formed in a manner that is consistent with the exemplary input capacitor 1802 shown in FIG. 18, except that the area underlying the polysilicon layer 1806 comprises an n-type semiconductor layer 1904 formed on at least a portion of an upper surface of the substrate (P-SUB) 1812. The n-type semiconductor layer 1904, in one or more embodiments, preferably comprises an NDD region which may be formed in a manner consistent with the NDD region in the low-side MOSFET device 1804. The n-type semiconductor layer 1904 is connected to ground through the N+ doped regions 1822 surrounding the polysilicon layer 1806 of the input capacitor 1902.

The whole chip area is generally not uniform as in an ideal case, and therefore it is desirable to distribute the input capacitor across the whole chip area to whatever extent possible. Illustrative structures have been described in which at least a portion of the input capacitor is directly integrated within the high-side power MOSFET device (e.g., as shown in FIG. 15) and/or within the low-side power MOSFET device (e.g., as shown in FIGS. 18 and 19). In one or more embodiments, the input capacitor structure can be separated from the power MOSFET devices (either high-side or low-side devices).

Figure 20:
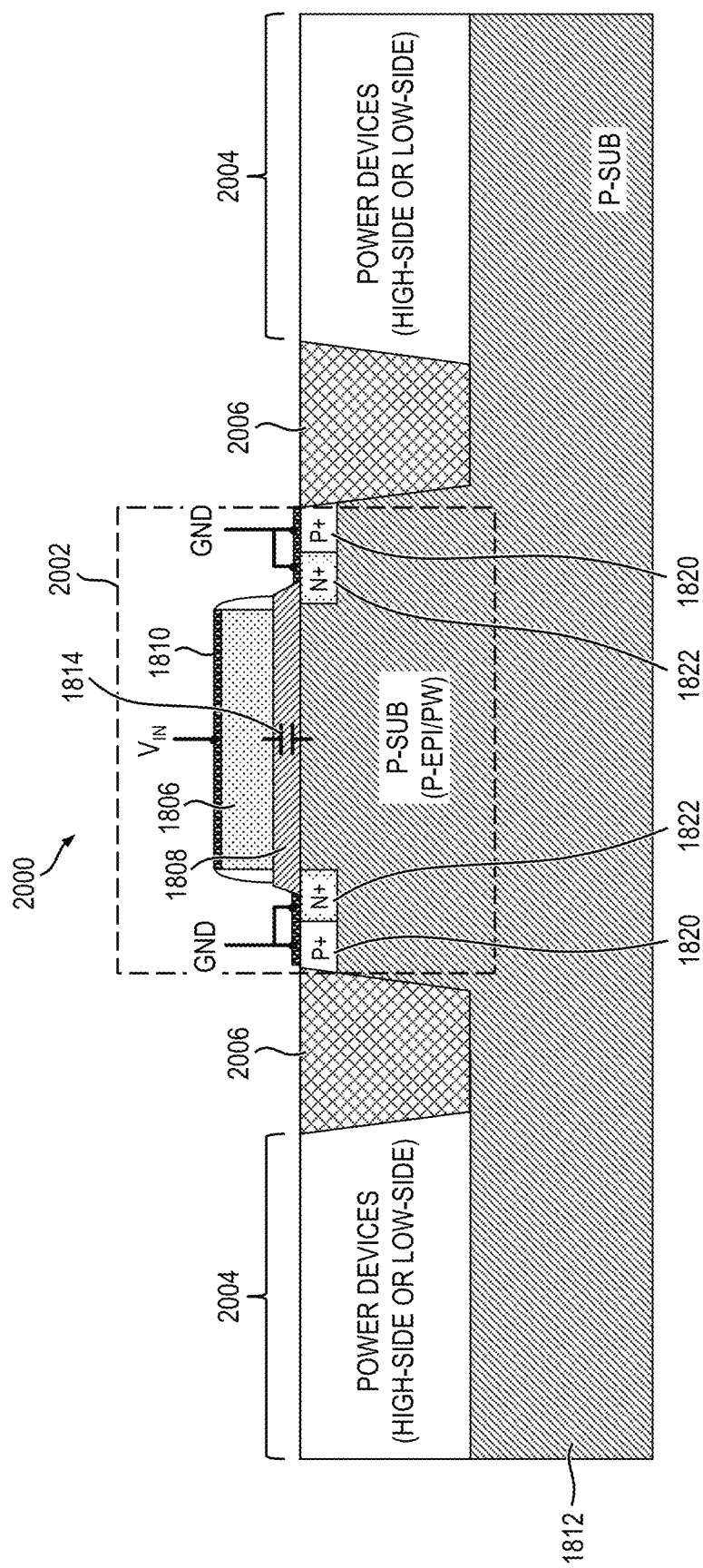
FIG. 20 is a cross-sectional view depicting at least a portion of an exemplary semiconductor structure comprising an input capacitor integrated on the same substrate as one or more power devices (either high-side or low-side MOSFET devices) and having a p-type doped layer as one of the plates of the capacitor structure, the capacitor being electrically isolated from the power devices, according to one or more embodiments of the present invention.

FIG. 20 is a cross-sectional view depicting at least a portion of an exemplary semiconductor structure 2000 comprising an input capacitor 2002 integrated on the same substrate as one or more power devices 2004 (either high-side or low-side MOSFET devices), but electrically isolated from the power devices, according to one or more embodiments of the invention. More particularly, with reference to FIG. 20, the semiconductor structure 2000 includes at least one capacitor 2002 and one or more power devices 2004 formed on a common substrate 1812, such as a p-type substrate (P-SUB) in this exemplary embodiment. The power devices 2004 are electrically isolated from the POS capacitor 2002 by isolation structures 2006, which may be implemented, for example, as shallow trench isolation (STI) structures, local oxidation of silicon (LOCOS) structures, junction or dielectric isolation structures, etc. The isolation structures 2006 are formed in the substrate 1812, proximate the upper surface of the substrate, with each isolation structure being disposed between the capacitor 2002 and the power devices 2004.

The input capacitor 2002 comprises the polysilicon layer 1806, which may have silicide layer 1810 optionally formed thereon, semiconductor layer 1812, and insulating layer 1808 sandwiched between the polysilicon and semiconductor layers to form a POS capacitor. Consistent with the illustrative semiconductor structure 1800 shown in FIG. 18, the semiconductor layer 1812 (e.g., silicon) underlying the insulating layer 1808 is doped with a p-type material (e.g., boron or aluminum) in this illustrative embodiment, although other embodiments of the invention contemplate that the semiconductor layer may be doped with an n-type material (e.g., phosphorus or arsenic), as will be described in further detail herein below in conjunction with FIG. 21. The semiconductor layer 1812 may be formed as a p-type substrate (P-SUB), or alternatively may be formed as a p-type epitaxial layer (P-EPI) or p-type well (PW) in a standard manner. In this exemplary embodiment, the input capacitor 2002 is configured having the polysilicon layer 1806 connected to the input voltage $V_{IN}$ and the semiconductor layer 1812 connected to ground via the first and second doped regions 1820 and 1822, respectively.

Figure 21:
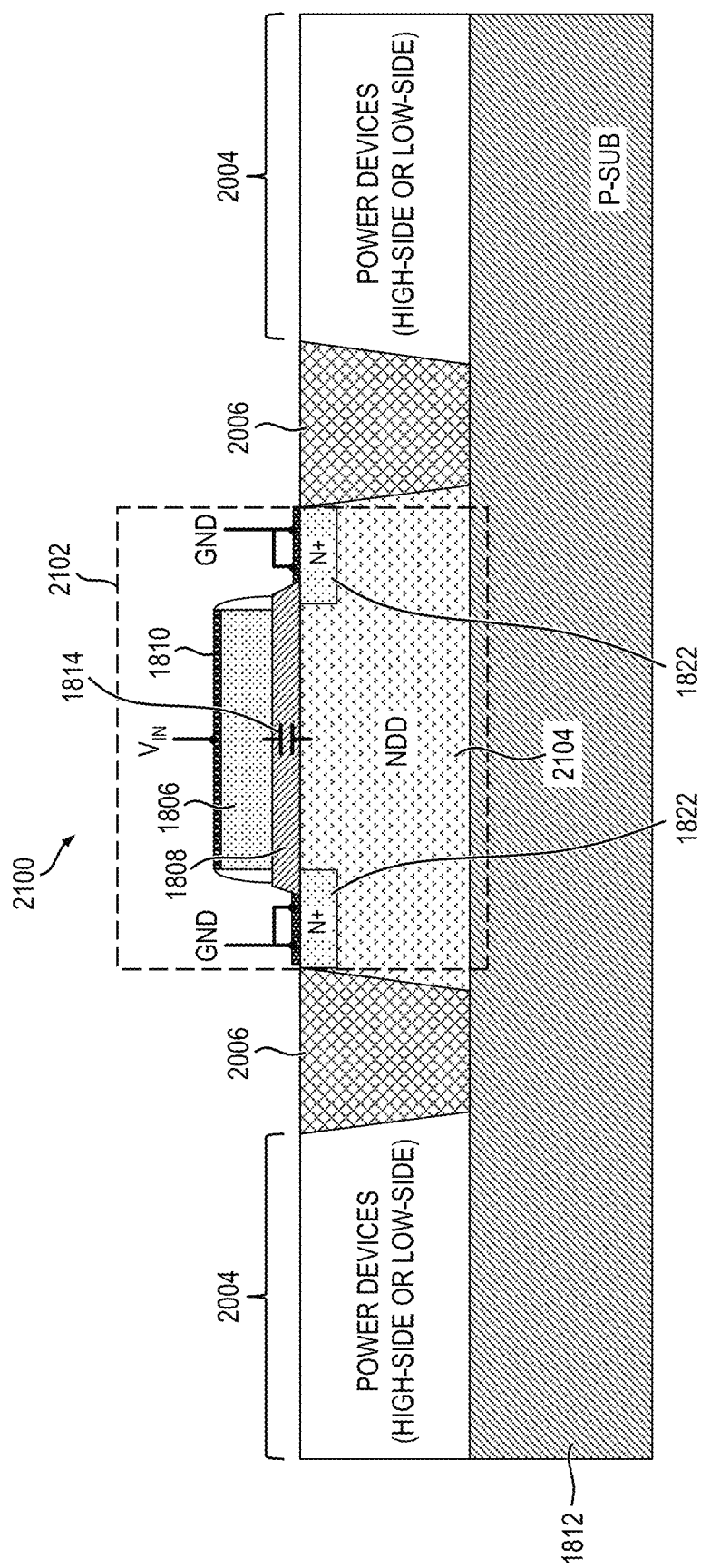
FIG. 21 is a cross-sectional view depicting at least a portion of an exemplary semiconductor structure comprising an input capacitor integrated on the same substrate as one or more power devices (either high-side or low-side MOSFET devices) and having an n-type doped layer as one of the plates of the capacitor structure, the capacitor being electrically isolated from the power devices, according to one or more other embodiments of the present invention.

FIG. 21 is a cross-sectional view depicting at least a portion of an exemplary semiconductor structure 2100 comprising an input capacitor 2102 integrated on the same substrate as one or more power devices 2004 (either high-side or low-side MOSFET devices) and electrically isolated from the power devices, according to one or more other embodiments of the invention. Similar to the exemplary semiconductor structure 2000 depicted in FIG. 20, the semiconductor structure 2100 includes at least one POS capacitor 2102 and one or more power devices 2004 (e.g., high-side and/or low-side power MOSFET devices) formed on the same substrate 1812, which is preferably a p-type substrate (P-SUB) in this embodiment. The power devices 2004 are electrically isolated from the POS capacitor 2102 by the isolation structures 2006 (e.g., STI structures, LOCOS structures, junction or dielectric isolation structures, etc.). The isolation structures 2006, which preferably comprise an oxide, are formed in the substrate 1812, proximate the upper surface of the substrate, with each isolation structure being disposed between the capacitor 2102 and the power devices 2004.

The capacitor 2102 includes the polysilicon layer 1806 having silicide layer 1810 optionally formed thereon. In this exemplary embodiment, the area underlying the polysilicon layer 1806 comprises an n-type semiconductor layer 2104 (e.g., doped with an n-type impurity, such as phosphorus or arsenic, of a prescribed concentration level) formed on at least a portion of an upper surface of the substrate (P-SUB) 1812. The n-type semiconductor layer 2104, in one or more embodiments, preferably comprises an NDD region which may formed in a manner consistent with the illustrative semiconductor structure 1900 shown in FIG. 19. The n-type semiconductor layer 2104, in this embodiment, is connected to ground through the N+ doped regions 1822 surrounding the polysilicon layer 1806 of the capacitor 2102. The capacitor 2102 further includes insulating layer 1808 disposed between the polysilicon layer 1806 and semiconductor layer 2104.

Figure 22:
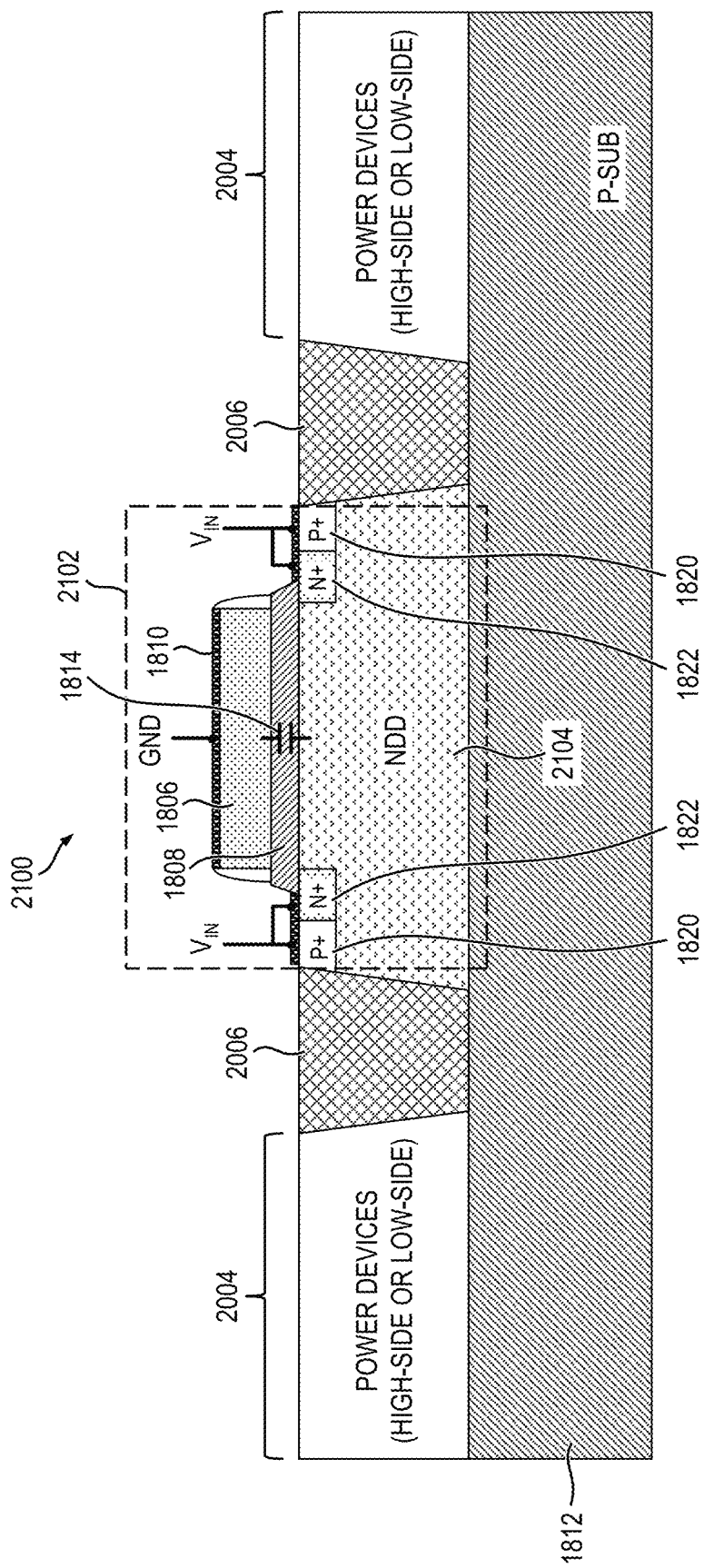
FIG. 22 is a cross-sectional view depicting at least a portion of the illustrative semiconductor structure shown in FIG. 21, with the polysilicon layer of the capacitor connected to ground, via a silicide layer, and the semiconductor layer connected to $V_{IN}$, via first and second doped regions, according to one or more embodiments of the present invention.

FIG. 22 is a cross-sectional view depicting at least a portion of the illustrative semiconductor structure 2100 shown in FIG. 21, with the polysilicon layer 1806 of the capacitor 2102 connected to ground, via the silicide layer 1810, and the semiconductor layer 2104 connected to $V_{IN}$, via the first and second doped regions 1820, 1822, according to one or more embodiments of the invention. With reference to FIG. 22, the capacitor 2102 includes the first doped regions 1820, doped with a p-type impurity at a prescribed doping concentration level, formed in the NDD region 2104 proximate an upper surface of the NDD region and adjacent to the second doped regions 1822, consistent with the formation of the first and second doped regions in the semiconductor structure 2000 shown in FIG. 20.

From the different exemplary connection arrangements of the illustrative semiconductor structure 2100 depicted in FIGS. 21 and 22, it is evident that the capacitor 2102, being configured in a manner that is independent of other circuit components in the semiconductor structure, is not limited to implementation as a input capacitor in a DC-DC converter circuit, but rather can be employed in essentially any circuit that requires a high-density, low-area capacitor.

At least a portion of the techniques of the present invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Any of the exemplary structures or devices illustrated in the accompanying figures, or portions thereof, may be part of an integrated circuit. Integrated circuits so manufactured are considered part of this invention.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having high-density integrated capacitor devices therein formed in accordance with one or more embodiments of the invention, such as, for example, DC-DC converters, radio frequency (RF) power amplifiers, etc.

An integrated circuit in accordance with aspects of the present disclosure can be employed in essentially any high-frequency, high-power application and/or electronic system. Suitable systems for implementing embodiments of the invention may include, but are not limited to, DC-DC converters. Systems incorporating such integrated circuits are considered part of this invention. Given the teachings of the present disclosure provided herein, one of ordinary skill in the art will be able to contemplate other implementations and applications of embodiments of the invention.

The illustrations of embodiments of the invention described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. The drawings are also merely representational and are not drawn to scale. Accordingly, the specification and drawings are to be regarded in an illustrative rather than a restrictive sense.

Embodiments of the invention are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation.

The corresponding structures, materials, acts, and equivalents of all means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, inventive subject matter lies in less than all features of a single embodiment. Thus, the following claims are hereby incorporated into the Detailed Description, with each claim standing on its own as separately claimed subject matter.

Given the teachings of embodiments of the invention provided herein, one of ordinary skill in the art will be able to contemplate other implementations and applications of the techniques of embodiments of the invention. Although illustrative embodiments of the invention have been described herein with reference to the accompanying drawings, it is to be understood that embodiments of the invention are not limited to those precise embodiments, and that various other changes and modifications are made therein by one skilled in the art without departing from the scope of the appended claims.

What is claimed is:

1. A capacitor configured for integration with at least one metal-oxide-semiconductor field-effect transistor (MOSFET) device formed on a same substrate, the capacitor comprising:
    a first plate comprising a doped semiconductor layer of a first conductivity type;
    an insulating layer formed on at least a portion of an upper surface of the doped semiconductor layer;
    a second plate comprising a polysilicon layer formed on at least a portion of an upper surface of the insulating layer, wherein an inversion layer is formed in the doped semiconductor layer, beneath at least a portion of the insulating layer and proximate the upper surface of the doped semiconductor layer, as a function of an applied voltage between the first and second plates of the capacitor; and
    at least one doped region of a second conductivity type formed in the doped semiconductor layer proximate the upper surface of the doped semiconductor layer and adjacent to one of a drain region and a source region of the first conductivity type formed in the MOSFET device, the doped region being electrically connected to the inversion layer, the second conductivity type being opposite in polarity to the first conductivity type.

2. The capacitor according to claim 1, wherein the at least one doped region of the second conductivity type comprises first and second doped regions of the second conductivity type, the first and second doped regions being electrically connected to and bounding the inversion layer in the doped semiconductor layer.

3. The capacitor according to claim 1, wherein the doped semiconductor layer comprises one of a substrate, an epitaxial layer, and a well of the first conductivity type.

4. The capacitor according to claim 1, wherein the insulating layer comprises an oxide.

5. The capacitor according to claim 1, further comprising a silicide layer formed on at least a portion of an upper surface of the polysilicon layer and at least a portion of an upper surface of the at least one doped region.

6. The capacitor according to claim 5, wherein the silicide layer is formed on at least a portion of an upper surface of the drain or source region of the MOSFET device, the silicide layer electrically connecting the drain or source region of the MOSFET device with the at least one doped region.

7. The capacitor according to claim 1, wherein the doped semiconductor layer of the first conductivity type forms a drain drift region in the MOSFET device.

8. The capacitor according to claim 1, wherein the doped semiconductor layer of the first conductivity type forms a body region in the MOSFET device.

9. The capacitor according to claim 1, wherein the first conductivity type is n-type and the second conductivity type is p-type.

10. The capacitor according to claim 1, wherein the MOSFET device is configured as a high-side transistor in a DC-DC voltage regulator circuit, the drain region of the MOSFET device and first plate of the capacitor being connected to an input voltage of the circuit, and the second plate of the capacitor being connected to ground.

11. The capacitor according to claim 1, wherein the MOSFET device is configured as a low-side transistor in a DC-DC voltage regulator circuit, the source region of the MOSFET device and first plate of the capacitor being connected to ground, and the second plate of the capacitor being connected to an input voltage of the circuit.

12. The capacitor according to claim 1, further comprising one or more isolation structures formed in the doped semiconductor layer, the isolation structures being disposed between the capacitor and the at least one MOSFET device so as to electrically isolate the capacitor from the MOSFET device.

13. The capacitor according to claim 12, wherein the isolation structure comprises at least one of a shallow trench isolation (STI) structure, a local oxidation of silicon (LOCOS) structure, a junction isolation structure, and a dielectric isolation structure.

14. A method of forming a capacitor configured for integration with at least one metal-oxide-semiconductor field-effect transistor (MOSFET) device, the method comprising:
    forming a first plate comprising a doped semiconductor layer of a first conductivity type;
    forming an insulating layer on at least a portion of an upper surface of the doped semiconductor layer;
    forming a second plate comprising a polysilicon layer on at least a portion of an upper surface of the insulating layer, wherein an inversion layer is created in the doped semiconductor layer, beneath at least a portion of the insulating layer and proximate the upper surface of the doped semiconductor layer, as a function of an applied voltage between the first and second plates of the capacitor; and
    forming at least one doped region of a second conductivity type in the doped semiconductor layer proximate the upper surface of the doped semiconductor layer and adjacent to one of a drain region and a source region of the first conductivity type formed in the MOSFET device, the doped region being electrically connected to the inversion layer, the second conductivity type being opposite in polarity to the first conductivity type.

15. The method according to claim 14, wherein forming the at least one doped region comprises forming first and second doped regions of the second conductivity type, the first and second doped regions being electrically connected to and bounding the inversion layer in the doped semiconductor layer.

16. The method according to claim 14, wherein the doped semiconductor layer comprises one of a substrate, an epitaxial layer, and a well of the first conductivity type.

17. The method according to claim 14, further comprising forming a silicide layer on at least a portion of an upper surface of the polysilicon layer and at least a portion of an upper surface of the at least one doped region.

18. The method according to claim 17, further comprising forming the silicide layer on at least a portion of an upper surface of the drain or source region of the MOSFET device.

19. The method according to claim 14, further comprising forming a drain drift region in the MOSFET device from the doped semiconductor layer of the first conductivity type.

20. The method according to claim 14, further comprising forming a body region in the MOSFET device from the doped semiconductor layer of the first conductivity type.

21. A DC-DC voltage converter circuit, comprising:
    a first metal-oxide-semiconductor field-effect transistor (MOSFET) device, the first MOSFET device having a drain coupled with an input node of the converter circuit, a source coupled with a switching node of the converter circuit, and a gate, the input node being adapted to receive an input voltage applied to the converter circuit;

a second MOSFET device, the second MOSFET device having a drain coupled with the switching node of the converter circuit, a source coupled with a voltage return of the converter circuit, and a gate;

a controller circuit coupled with the first and second MOSFET devices, the controller circuit being configured to generate first and second control signals supplied to the gates of the first and second MOSFET devices for controlling activation of the MOSFET devices;

at least one energy storage element coupled between the switching node and an output of the converter circuit; and an input capacitor coupled between the input node and voltage return of the converter circuit, the input capacitor being integrated with at least one of the first and second MOSFET devices, the input capacitor comprising:

a first plate comprising a doped semiconductor layer of a first conductivity type, the doped semiconductor layer forming at least one of a drift drain region and a body region of at least one of the first and second MOSFET devices;

an insulating layer formed on at least a portion of an upper surface of the doped semiconductor layer;

a second plate comprising a polysilicon layer formed on at least a portion of an upper surface of the insulating layer, wherein an inversion layer is formed in the doped semiconductor layer, beneath at least a portion of the insulating layer and proximate the upper surface of the doped semiconductor layer, as a function of the input voltage applied between the first and second plates of the capacitor; and at least one doped region of a second conductivity type formed in the doped semiconductor layer proximate the upper surface of the doped semiconductor layer and adjacent to one of the drain and the source of at least one of the first and second MOSFET devices, the doped region being electrically connected to the inversion layer, the second conductivity type being opposite in polarity to the first conductivity type.

* * * * *

UNITED STATES PATENT AND TRADEMARK OFFICE
CERTIFICATE OF CORRECTION

PATENT NO. : 12,446,298 B2
APPLICATION NO. : 17/745304
DATED : October 14, 2025
INVENTOR(S) : Xu et al.

It is certified that error appears in the above-identified patent and that said Letters Patent is hereby corrected as shown below:

In the Specification

Column 7, Line 31: Please correct "($R_D$S-on)" to read --($R_{DS\text{-}on}$)--

Column 7, Line 52: Please correct "$\varepsilon_0=8.854\times10^{-12\circ}$ F./m" to read --$\varepsilon_0=8.854\times10^{-12}$ F/m--

Column 9, Line 43: Please correct "afield" to read --a field--

Column 12, Line 17: Please correct "$C_g a$" to read --$C_{gd}$--

Column 16, Line 39: Please correct "Cir" to read --$C_{IN}$--

Column 16, Line 43: Please correct "Cir" to read --$C_{IN}$--

Column 17, Line 65: Please correct "$C_{iN}$" to read --$C_{IN}$--

Column 19, Line 59: Please correct "$C_{In}$" to read --$C_{IN}$--

Signed and Sealed this
Twenty-seventh Day of January, 2026

John A. Squires
*Director of the United States Patent and Trademark Office*